United States Patent
Dykaar

(10) Patent No.: US 9,859,348 B2
(45) Date of Patent: Jan. 2, 2018

(54) ELECTRONIC DEVICE AND METHOD OF MAKING THEREOF

(71) Applicant: DIFTEK LASERS, INC., Waterloo (CA)

(72) Inventor: Douglas R. Dykaar, Waterloo (CA)

(73) Assignee: DIFTEK LASERS, INC., Waterloo, Ontario (CA)

( * ) Notice: Subject to any disclaimer, the term of this patent is extended or adjusted under 35 U.S.C. 154(b) by 0 days.

(21) Appl. No.: 15/235,472

(22) Filed: Aug. 12, 2016

(65) Prior Publication Data

US 2016/0351642 A1 Dec. 1, 2016

Related U.S. Application Data

(63) Continuation-in-part of application No. 14/879,884, filed on Oct. 9, 2015, now Pat. No. 9,455,307, which
(Continued)

(51) Int. Cl.
*H01L 27/32* (2006.01)
*H01L 51/52* (2006.01)
(Continued)

(52) U.S. Cl.
CPC ...... *H01L 27/3253* (2013.01); *H01L 27/3262* (2013.01); *H01L 27/3276* (2013.01);
(Continued)

(58) Field of Classification Search
CPC . H01L 27/3253; H01L 51/56; H01L 51/5246; H01L 27/14612; H01L 27/14636;
(Continued)

(56) References Cited

U.S. PATENT DOCUMENTS

| 4,430,150 A | 2/1984 | Levine et al. |
| 4,479,847 A | 10/1984 | McCaldin et al. |

(Continued)

FOREIGN PATENT DOCUMENTS

| EP | 0663689 A2 | 7/1995 |
| EP | 1693903 A1 | 8/2006 |

(Continued)

OTHER PUBLICATIONS

2nd Notice of Reasons for Rejection dated Jul. 12, 2016 with English Translation.
(Continued)

*Primary Examiner* — Jessica Manno
*Assistant Examiner* — Mohammed R Alam
(74) *Attorney, Agent, or Firm* — Perry + Currier, Inc.

(57) ABSTRACT

As a cost effective alternative to lithography, there is provided a method of forming an electronic device comprising the steps of: depositing a first quantity of a first liquid medium comprising a dopant on a first portion of a planar surface and depositing a second quantity of the first liquid medium on a second portion of the surface, the first quantity spaced from the second quantity by a gap; heating the first quantity, the second quantity, and the surface, the heating configured to cause diffusion of at least some of the dopant from the first liquid medium into the surface; depositing a dielectric material on the surface in the gap; selectively removing the first quantity and the second quantity from the surface; depositing an electrical contact on each of the first portion and the second portion; and depositing a further electrical contact on the dielectric material.

23 Claims, 16 Drawing Sheets

Related U.S. Application Data is a continuation-in-part of application No. 13/992,063, filed as application No. PCT/CA2012/000956 on Oct. 12, 2012, now Pat. No. 9,224,851, said application No. 14/879,884 is a continuation-in-part of application No. 14/019,131, filed on Sep. 5, 2013, now Pat. No. 9,209,019, application No. 15/235,472, which is a continuation-in-part of application No. 15/184,429, filed on Jun. 16, 2016, which is a continuation-in-part of application No. 14/610,567, filed on Jan. 30, 2015, now Pat. No. 9,396,932.

(60) Provisional application No. 61/547,110, filed on Oct. 14, 2011, provisional application No. 62/007,624, filed on Jun. 4, 2014.

(51) Int. Cl.
*H01L 51/56* (2006.01)
*H01L 31/00* (2006.01)
*H01L 27/146* (2006.01)

(52) U.S. Cl.
CPC .......... *H01L 31/00* (2013.01); *H01L 51/5246* (2013.01); *H01L 51/56* (2013.01); *H01L 27/14658* (2013.01); *H01L 2227/323* (2013.01)

(58) Field of Classification Search
CPC ........... H01L 27/14661; H01L 27/3262; H01L 27/3276; H01L 27/1469; H01L 2227/323; B29C 33/44; C30B 19/068; C30B 29/06; C30B 11/007; C30B 15/30; C30B 28/04
See application file for complete search history.

(56) References Cited

U.S. PATENT DOCUMENTS

| | | | |
|---|---|---|---|
| 5,086,003 A | 2/1992 | Hammerbacher | |
| 5,431,127 A | 7/1995 | Stevens et al. | |
| 5,955,776 A * | 9/1999 | Ishikawa ................ | C30B 25/18 257/1 |
| 6,316,278 B1 | 11/2001 | Jacobsen et al. | |
| 6,440,785 B1 | 8/2002 | Yamazaki et al. | |
| 6,744,073 B1 * | 6/2004 | Nakata ................ | H01L 25/0753 257/81 |
| 6,844,673 B1 | 1/2005 | Bernkopf | |
| 7,078,275 B2 | 7/2006 | Hiroshima et al. | |
| 7,737,006 B2 | 6/2010 | Colfer et al. | |
| 8,088,676 B2 | 1/2012 | Wong et al. | |
| 8,846,505 B2 | 9/2014 | Einav | |
| 9,067,792 B1 | 6/2015 | Hariharan et al. | |
| 9,209,019 B2 | 12/2015 | Dykaar | |
| 9,224,851 B2 | 12/2015 | Dykaar | |
| 2002/0074655 A1 * | 6/2002 | Uchiyama ................ | H01L 24/11 257/737 |
| 2003/0234398 A1 | 12/2003 | Aoki et al. | |
| 2004/0248429 A1 | 12/2004 | Aoki | |
| 2006/0040435 A1 | 2/2006 | Morisue et al. | |
| 2006/0148166 A1 | 7/2006 | Craig et al. | |
| 2007/0173000 A1 * | 7/2007 | Yamazaki ......... | H01L 21/76254 438/151 |
| 2010/0019665 A1 | 1/2010 | Kwon et al. | |
| 2010/0167441 A1 * | 7/2010 | Ray ........................... | G09G 3/32 438/29 |
| 2012/0067273 A1 | 3/2012 | Sachs et al. | |

FOREIGN PATENT DOCUMENTS

| | | |
|---|---|---|
| EP | 2099064 A1 | 9/2009 |
| EP | 2833391 A1 | 2/2015 |
| JP | 1986171165 | 8/1986 |
| JP | 1989276750 | 11/1989 |
| JP | 2001230439 A | 8/2001 |
| JP | 2002111021 A | 4/2002 |
| JP | 2014203675 A | 10/2014 |
| KP | 20070032488 A | 3/2007 |
| WO | WO-9828947 A1 | 7/1998 |
| WO | 2005041286 A1 | 5/2005 |
| WO | WO-2008057483 A2 | 5/2008 |
| WO | WO-2012102343 A1 | 8/2012 |

OTHER PUBLICATIONS

Ishihara, Ryoichi, et al., "Solution Processed Single-Grain Si TFTs on a Plastic Substrate", SID Symposium Digest of Technical Papers, vol. 45, Issue 1, pp. 439?442, Jun. 2014 (Article first published online: Jul. 7, 2014).

Imanaka, Yoshihiko, "Multilayered Low Temperature Cofired Ceramics (LTCC) Technology", Chapter 7 title: Printing and Laminating, pp. 145-166, (2005) Springer US.

Nojiri, Takeshi "Doping Paste for Photovoltaic Solar Cell", Hitachi Chemical Technical Report No. 56.

Gao, Yu et al., "Doping Silicon Wafers with Boron by Use of Silicon Paste", J. Mater. Sci. Technol., 2013, 29(7), 652-654.

Lim, Taewoong et al., "Experimental Study on Spreading and Evaporation of Inkjet Printed Pico-Liter Droplet on a Heated Substrate", International Journal of Heat and Mass Transfer 52 (2009) 431-441.

Sirringhaus, H. et al., "High-Resolution Inkjet Printing of All-Polymer Transistor Circuits", www.sciencemag.org, Science, vol. 290, Dec. 15, 2000.

Stuwe, D. et al.,"InkJet-Printed Diffusion Sources", Presented at the 29th European PV Solar Energy Conference and Exhibition, Sep. 22-26, 2014, Amsterdam (NL).

Meena, Jagan Singh et al., "Polystyrene-block-poly(methylmethacrylate) composite material film as a gate dielectric for plastic thin-film transistor applications", The Royal Society of Chemistry 2014, RSC Adv., 2014, 4, 1843-18502.

"Printable Dopants for Advanced c-Si Cells", Honeywell Electronic Materials, www.honeywell.com/sm/em.

Daniel, Jurgen, "Printed Electronics: Technologies, Challenges and Applications", Palo Alto Research Center, International Workshop on Flexible and Printed Electronic (IWFPE 10), Sep. 8-10, Muju Resort, Korea.

Li, Jian-Guo, "Wetting of Ceramic Materials by Liquid Silicon, Aluminium and Metallic Melts Containing Titanium and Other Reactive Elements: A Review", Ceramics International 20 (1994) 391-412, 1994.

Kugimiya, K., et al., "101-Stage 2 ?m Gate Ring Oscillators in Laser-Grown Silicon Islands Embedded in SiO2", IEEE Electron Device Letters, p. 270-272, vol. EDL-3, No. 9, Sep. 1982.

Scharff, W., et al., "Growth of Monocrystalline Silicon Islands on Insulating Substrates", Thin Solid Films, 113(1984) 327-335.

Henke, Thomas, et al., "Formation of Regularly Arranged Large Grain Silicon Islands by Using Embedded Micro Mirrors in the Flash Crystallization of Amorphous Silicon", Journal of Applied Physics 115, 034301 (2014); view online: http://dx.doi.org/10.1063/1.4861398, published by AIP Publishing.

Chen, Tao, et al., "Location- and Orientation-Controlled (100) and (110) Single-Grain Si TFTs Without Seed Substrate", IEEE Transactions on Electron Devices, p. 2348-2352, vol. 57, No. 9, Sep. 2010.

van der Wilt, Paul Ch., et al. "Formation of Location-Controlled Crystalline Islands Using Substrate-Embedded Seeds in Excimer-Laser Crystallization of Silicon Films", Applied Physics Letters 79, 1819 (2001);view online: http://dx.doi.org/10.1063/1.1402641, published by AIP Publishing.

Matsuki, Nobuyuki, et al., "Investigation of Local Electrical Properties of Coincidence-Site-Lattice Boundaries in Location-Controlled Silicon Islands Using Scanning Capacitance Microscopy", Applied Physics Letters 93, 062102 (2008); view online: http://dx.doi.org/10.1063/1.2968663, published by AIP Publishing.

(56) References Cited

OTHER PUBLICATIONS

Zhang, J., et al., "Single-Grain Si Thin-Film Transistors on Flexible Polyimide Substrate Fabricated From Doctor-Blade Coated Liquid-Si", Applied Physics Letters 102, 243502 (2013); view online: http://dx.doi.org/10.1063/1.4811356.
Itoh Hironori et al: "In situ observation of melting and crystallization of Si on porous Si3N4substrate that repels Si melt", Journal of Crystal Growth, Elsevier, Amsterdam, NL, vol. 401, Mar. 12, 2014 (Mar. 12, 2014), pp. 359-363, XP029040773, ISSN: 0022-0248. DOI: 10.1016/J.JCRYSGRO.2014.02.044, the whole document.
Official Communication dated Aug. 26, 2015 for European Patent Application No. 15153173.8.
Drevet B et al: "Wetting, infiltration and sticking phenomena in Si3N4 releasing coatings in the growth of photovoltaic silicon", Solar Energy Materials and Solar Cells, Elsevier Science Publishers, Amsterdam, NL, vol. 94, No. 3, Mar. 2010, pp. 425-431, XP026878452, ISSN: 0927-0248 [retrieved on Nov. 28, 2009]. pp. 425-426, chapter 2, Experimental procedure. pp. 426-430, chapter 3, Results and discussion. Figures 2-6, 9, 12.
Liu et al: "A concentrator module of spherical Si solar cell", Solar Energy Materials and Solar Cells, Elsevier Science Publishers, Amsterdam, NL, vol. 91, No. 19, Sep. 14, 2007 (Sep. 14, 2007), pp. 1805-1810, XP022245075, ISSN: 0927-0248, DOI:10.1016/J.SOLMAT.2007.06.008 *figure 3*.
Extended European Search Report dated Jan. 15, 2016 for European Patent Application No. 15153173.8.
Notice of Allowance dated Mar. 16, 2016 for U.S. Appl. No. 14/610,567.
Notice of Reasons for Rejection dated Aug. 2, 2016 for Japanese Patent Application No. 2015-107915.
1st Notice of Reasons for Rejection dated Jan. 12, 2016 with English Translation for Japanese Patent Application No. 2014-534897.
2nd Notice of Reasons for Rejection dated Jul. 12, 2016 with English Translation for Japanese Patent Application No. 2014-534897.
Extended European Search Report dated Apr. 4, 2017 for European Patent Application No. 14182511.7.
Partial European Search Report, dated Jun. 9, 2017, by EPO, re European Patent Application No. 17151980.4. 15 pages.
Extended European Search Report dated Sep. 13, 2017, by EPO, re European Patent Application No. 17151980.
Extended European Search Report (EESR) dated Oct. 13, 2017, by EPO, re European Patent Application No. 17001028.4.
Office Action (with English translation) dated Oct. 24, 2017, by JPO, re Japanese Patent Application No. 2014-173705.

\* cited by examiner

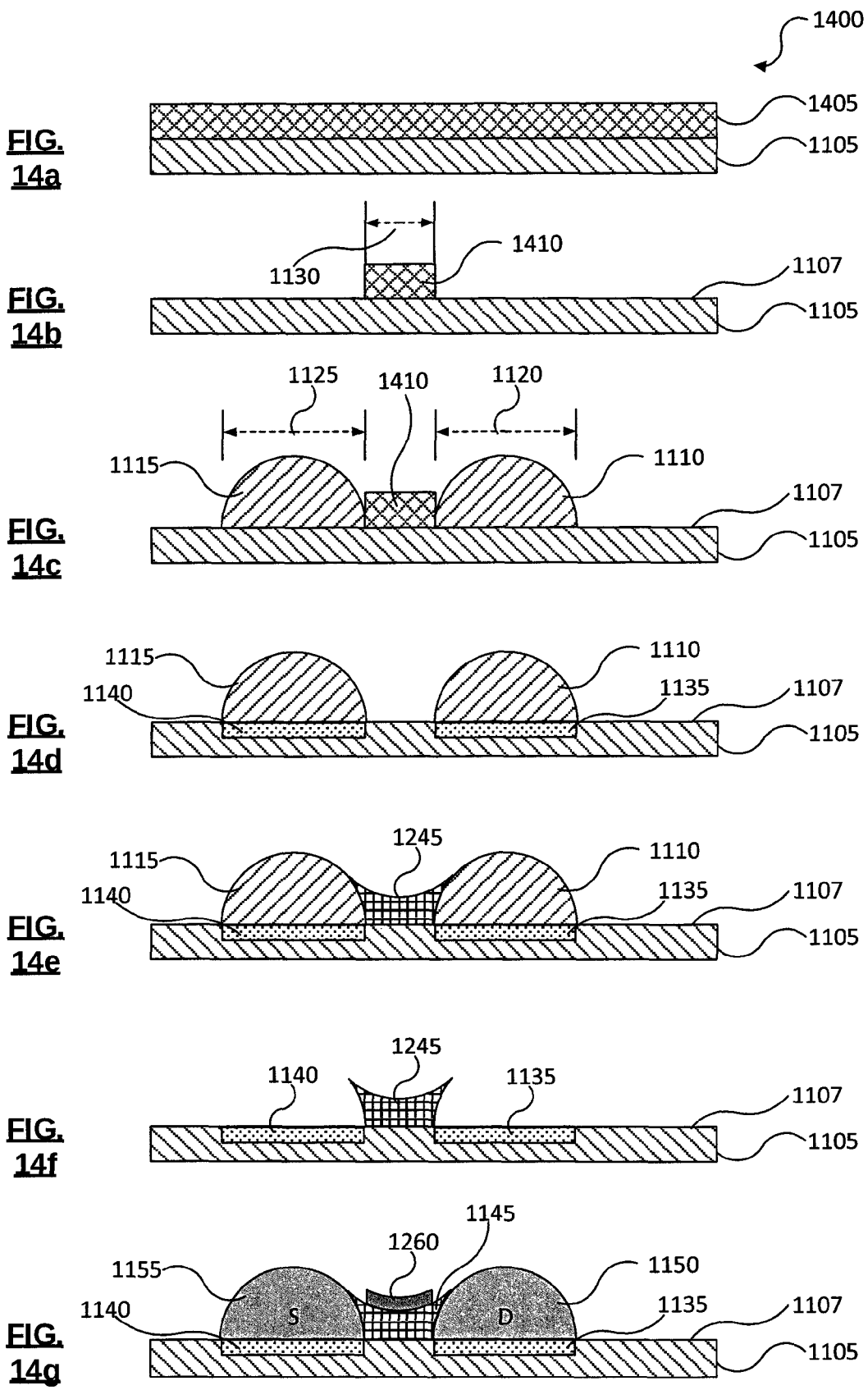

ELECTRONIC DEVICE AND METHOD OF MAKING THEREOF

CROSS-REFERENCE TO RELATED APPLICATION

This application is a continuation-in-part of U.S. patent application Ser. No. 14/879,884, filed on Oct. 9, 2015, which is incorporated herein by reference in its entirety. U.S. Ser. No. 14/879,884, in turn, is a continuation-in-part of U.S. patent application Ser. No 13/992,063, which is the National Stage of International Application No PCT/CA12/000956, filed Oct. 12, 2012, which claims the benefit of U.S. Provisional Application No. 61/547,110, the contents of which are incorporated herein by reference in its entirety. U.S. Ser. No. 14/879,884 is also a continuation-in-part of U.S. patent application Ser. No. 14/019,131, filed on Sep. 5, 2013, which is incorporated herein by reference in its entirety.

This application is also a continuation-in-part of U.S. patent application Ser. No. 15/184,429, filed on Jun. 16, 2016, which is incorporated herein by reference in its entirety. U.S. Ser. No. 15/184,429, in turn, is a continuation-in-part of U.S. patent application Ser. No. 14/610,567, filed on Jan. 30, 2015 and now issued as U.S. Pat. No. 9,396,932, which is also incorporated herein by reference in its entirety. U.S. Ser. No. 14/610,567, in turn, claims the benefit of U.S. Provisional Application No. 62/007,624.

FIELD OF THE INVENTION

The present invention relates to electronic devices and methods of making thereof, and in particular to printable electronic devices and methods of making thereof.

BACKGROUND OF THE INVENTION

Single-crystal silicon is used for most electronic applications. Exceptions exist, such as displays and some imagers, where amorphous silicon is applied to non-semiconductor substrates in order to operate the display or imager pixel. In many applications, the display or imager is fabricated on top of the silicon electronics. For application to liquid crystal displays (LCDs), amorphous silicon has provided sufficient performance. For next generation display devices such as Organic Light Emitting Diodes (OLED), Active Matrix (AM) drive transistors made from amorphous silicon have proven problematic. Fundamentally, LCDs use voltage devices, and AM-OLEDs require current devices. Attempts to extend the conventional approach involve modifying the prior-art amorphous silicon on glass. Amorphous-silicon is applied to the entire substrate panel, typically greater than two meters on a side, then is re-crystallized using large excimer lasers and scanning a line focus across the panel. The laser has to be pulsed so as to only melt the Si surface and not the glass. This technique results in the formation of poly-crystal silicon rather than single-crystal silicon. For some detector applications, Si wafers are butted together to form larger, albeit more expensive devices.

The mobility of any type of amorphous or poly-crystalline transistor, including non-silicon and organic devices, is much smaller than the mobility of single-crystal silicon transistors. Electron mobility in amorphous silicon is ~1 $cm^2/V \cdot s$ compared to ~100 $cm^2/V \cdot s$ for poly-silicon, and ~1500 $cm^2/V \cdot s$ for high-quality single-crystal silicon. It is therefore advantageous to use single-crystal silicon in place of amorphous silicon in such devices. In a preferred embodiment of the present invention a plurality of planar single-crystal silicon regions on a non-silicon substrate at predetermined locations, for the purpose of electronic device fabrication is fabricated. For example, wafers of single crystal silicon are too costly for large displays and too small in size: Silicon wafers are typically 300 mm in diameter, compared to current LCD panels at more than 2 meters on a side. By comparison, approximately spherical particles, spheres or spheroidal particles of single-crystal silicon have been manufactured in large sizes less than or equal to 2 mm, which is large compared to individual pixel sizes. U.S. Pat. No. 4,637,855, incorporated herein by reference, entitled Process For Producing Crystalline Spherical Spheres, Filed Apr. 30, 1985 in the names of Witter et al., describes the manufacture of crystalline spheres.

In the past others have attempted to place diodes upon a curved surface of a silicon spheroid however this has proved to be challenging. In the prior art, attempts have been made to lithographically define structures on spherical surfaces, but this requires non-standard optics and has had limited success. Making electrical contacts to non-planar surfaces also requires non-standard techniques. The complexities involved in fabrication have prevented any real progress.

Curved surfaces of Si spheres have also been doped with an n-type dopant to form n-type Si surrounding a p-type Si region which comprises the majority of the surface of a sphere. An embodiment of this invention relates to the field of photovoltaic devices, in that the planar surface and region directly below can be doped for example with an n-type dopant and a region below with a p-type dopant so as to form a solar cell. A silicon sphere solar cell is described in a paper entitled Crystal Characterization of Spherical Silicon Solar Cell by X-ray Diffraction by Satoshi OMAE, Takashi MINEMOTO, Mikio MUROZONO, Hideyuki TAKAKURA and Yoshihiro HAMAKAWA, Japanese Journal of Applied Physics Vol. 45, No. 5A, 2006, pp. 3933-3937 #2006 The Japan Society of Applied Physics.

This invention however overcomes the limitations of the aforementioned prior art by conveniently utilizing the surface area and region about the planar surface on a planarized particle to fabricate electronic devices. A planar region having structures formed therein provides a convenient reliable way in which to provide electrical contacts to different parts of the device. Such electronic devices have traditionally been fabricated using lithographic techniques. However, lithography requires complex equipment and controlled environments, and as a result can be very expensive.

Another very important aspect of this invention is that it enables a technology that has a smaller carbon footprint by allowing circuits to be built that consume less power than similar circuitry which utilizes LCD technology.

In displays with previous generation LCD technology, white light is provided to the rear of the panel of the display, and each LCD pixel uses a filter to select Red (R), Green (G), or Blue (B) light. Filtering in this manner wastes ⅔ of the energy in the backlight. In addition the operation of the LCD pixel is dependent on the light being polarized, so further losses are incurred by the polarizer. In addition, part of each pixel is occupied by the amorphous silicon transistor, which blocks light coming through the panel.

The present invention enables production of large OLED panels, which are more efficient that LCD panels. OLED pixels emit at the desired color, R, G, or B only, so no energy is wasted creating other colors, which are then filtered out and which produce waste in the form of heat. In addition, the OLED emitters can be fabricated on top of the backplane electronics, so the emission area can be maximized without blocking light emitting areas of the pixel. By placing the backplane electronics out of the light path, the design can be optimized for speed and low power dissipation, as opposed to being compromised for light path requirements.

SUMMARY OF THE INVENTION

According to an embodiment of the present invention there is provided a method of forming an active matrix OLED display, the method comprising: providing a backplane comprising: providing a backplane substrate; providing semiconductor particles formed separately from the backplane substrate; positioning the semiconductor particles at predetermined positions on the backplane substrate; immovably fixing the semiconductor particles to the backplane substrate at the predetermined positions; after immovably fixing the semiconductor particles, removing portions of each of the semiconductor particles so as to expose cross-sections of the semiconductor particles, wherein the cross-sections are planar surfaces; and providing one or more controllable gated electronic components on or directly beneath each planar surface, the controllable gated electronic components configured to control pixels of the active matrix OLED display. The method also comprises providing an OLED assembly comprising one or more pixel regions, the OLED assembly electrically connected to the backplane such that at least one of the pixel regions is electrically connected to corresponding one or more of the controllable gated electronic components.

The planar surfaces can be less than 15 mm and greater than 1 µm across a longest dimension; and the providing the backplane can further comprise providing at least two electrical contacts to each controllable gated electronic component supported by the planar surface.

According to another embodiment of the present invention there is provided a method of forming an active matrix OLED display, the method comprising: providing a backplane comprising: a backplane substrate; a semiconductor particle formed separately from the backplane substrate and then fixed upon the backplane substrate at a predetermined position; the semiconductor particle planarized to remove portions of the semiconductor particle and to expose at a cross-section of the semiconductor particle a planar surface; and a controllable gated electronic component on or directly beneath the planar surface, the controllable gated electronic component configured to control one or more pixels of the active matrix OLED display. The method further comprises providing an OLED assembly comprising one or more pixel regions, the OLED assembly electrically connected to the backplane such that at least one of the pixel regions of the OLED assembly is electrically connected to the controllable gated electronic component.

The OLED assembly can be formed separately from the backplane on an OLED substrate different from the backplane substrate, the OLED assembly comprising one or more pixel contacts corresponding to each pixel region; and the providing the OLED assembly electrically connected to the backplane can comprise: joining the OLED assembly to the backplane, the joining comprising electrically connecting at least one of the pixel contacts corresponding to the at least one of the pixel regions to the controllable gated electronic component.

The method can further comprise: before the joining, aligning the OLED assembly and the backplane with each other in order to align the at least one pixel contact corresponding to the at least one of the pixel regions with the controllable gated electronic component.

The method can further comprise backfilling with a substantially black underfill at least a portion of gaps between the OLED assembly and the backplane joined together.

The electrically connecting can comprise using one or more of a conductive epoxy, a solder, and low temperature solder to connect at least one of the one or more pixel contacts to the controllable gated electronic component.

The backplane can further comprise: a conformal coating covering the backplane substrate and at least a portion of the semiconductor particle; and wherein: the semiconductor particle can be planarized to further remove portions of the conformal coating; the planar surface can be less than 15 mm across its longest dimension; at least a portion of the semiconductor particle directly below or on the planar surface can be doped with a first dopant of a first type and wherein another portion of the semiconductor particle directly below or on the planar surface can be doped with a second dopant of a second type, one of the first and second dopants being n-type; and the controllable gated electronic component can comprise: a first contact at or above the planar surface contacting the first dopant; and, a second contact at or above the planar surface contacting the second dopant; and the electrical connection can comprise a conductive link between one of the first contact and the second contact and the at least one pixel region.

According to another embodiment of the present invention there is provided an active matrix OLED display comprising: a backplane comprising: a backplane substrate; a semiconductor particle formed separately from the backplane substrate and then fixed upon the backplane substrate at a predetermined position; the semiconductor particle planarized to remove portions of the semiconductor particle and to expose at a cross-section of the semiconductor particle a planar surface; and a controllable gated electronic component on or directly beneath the planar surface; and an OLED assembly comprising one or more pixel regions, the OLED assembly electrically connected to the backplane such that at least one pixel region of the OLED assembly is electrically connected to the controllable gated electronic component, the electrical connection configured to allow the controllable gated electronic component to control the at least one pixel region of the OLED assembly.

The active matrix OLED display can further comprise a substantially black underfill filling at least a portion of gaps between the OLED assembly and the backplane joined together.

The active matrix OLED display wherein the backplane can further comprise: a conformal coating covering the backplane substrate and at least a portion of the semiconductor particle; and wherein: the semiconductor particle can be planarized to further remove portions of the conformal coating; the planar surface can be less than 15 mm across its longest dimension; at least a portion of the semiconductor particle directly below or on the planar surface can be doped with a first dopant of a first type and wherein another portion of the semiconductor particle directly below or on the planar surface can be doped with a second dopant of a second type, one of the first and second dopants being n-type; and the controllable gated electronic component can comprise: a first contact at or above the planar surface contacting the first dopant; and, a second contact at or above the planar surface contacting the second dopant; and the electrical connection can comprise a conductive link between one of the first contact and the second contact and the at least one pixel region.

According to another embodiment of the present invention there is provided an imager comprising: a detector assembly for detecting photons and, in response, producing an electrical signal; a backplane comprising: a backplane substrate; a semiconductor particle formed separately from the backplane substrate and then fixed upon the backplane substrate at a predetermined position; the semiconductor particle planarized to remove portions of the semiconductor particle and to expose at a cross-section of the semiconductor particle a planar surface; and a controllable gated electronic component on or directly beneath the planar surface; and an electrical connection between the controllable gated electronic component and the detector assembly, the electrical connection configured to allow the controllable gated electronic component to sample the electrical signal.

The detector assembly can be an X-ray detector.

The imager wherein the backplane can further comprise: a conformal coating covering the backplane substrate and at least a portion of the semiconductor particle; and wherein: the semiconductor particle can be planarized to further remove portions of the conformal coating; the planar surface can be less than 15 mm across its longest dimension; at least a portion of the semiconductor particle directly below or on the planar surface can be doped with a first dopant of a first type and wherein another portion of the semiconductor particle directly below or on the planar surface can be doped with a second dopant of a second type, one of the first and second dopants being n-type; and the controllable gated electronic component can comprise: a first contact at or above the planar surface contacting the first dopant; and, a second contact at or above the planar surface contacting the second dopant; and the electrical connection can comprise a conductive link between one of the first contact and the second contact and the detector assembly.

According to another embodiment of the present invention there is provided a method of fabricating a backplane, the method comprising: providing a backplane substrate comprising one or more predetermined positions each configured to receive one semiconductor particle; providing semiconductor particles formed separately from the backplane substrate; placing the semiconductor particles on the backplane substrate; mechanically agitating the backplane substrate and the semiconductor particles to cause one semiconductor particle to occupy each position; securing the semiconductor particles to the backplane substrate at each respective position; and after the securing the semiconductor particles at each respective position, removing portions of each of the semiconductor particles so as to expose cross-sections of the semiconductor particles, the cross-sections being planar surfaces.

The method can further comprise: providing at least one controllable gated electronic component on or directly beneath each planar surface.

The mechanically agitating can comprise vibrating the backplane substrate.

The mechanically agitating can comprise one or more of: rotating the backplane substrate about one or more axes; and translating the backplane substrate in one or more directions.

The securing can comprise, before the placing the semiconductor particles on the backplane substrate, applying an adhesive to each position, the adhesive configured to secure at least one semiconductor particle at each respective position to the backplane substrate.

The securing can comprise heating the semiconductor particles and the backplane substrate to fuse the semiconductor particles to the backplane substrate.

The securing can comprise, after the mechanically agitating, applying a conformal coating onto the backplane substrate to at least partially cover the semiconductor particles and the backplane substrate; and the removing can further comprise removing at least a portion of the conformal coating covering the semiconductor particles to expose the planar surfaces.

According to another embodiment of the present specification there is provided a method of forming a plurality of electronic devices on a substrate, the method comprising: providing semiconductor particles formed separately from the substrate; positioning the semiconductor particles at predetermined positions on the substrate; immovably fixing the semiconductor particles to the substrate at the predetermined positions; after immovably fixing the semiconductor particles, removing portions of each of the semiconductor particles so as to expose cross-sections of the semiconductor particles, wherein the cross-sections are planar surfaces; and providing one or more controllable gated electronic components on or directly beneath each planar surface. The providing the one or more controllable gated electronic components comprises, for each planar surface: depositing a first quantity of a first liquid medium comprising a dopant on a first portion of the planar surface and depositing a second quantity of the first liquid medium on a second portion of the planar surface, the first quantity spaced from the second quantity by a gap; heating the first quantity, the second quantity, and the corresponding semiconductor particle, the heating configured to cause diffusion of at least some of the dopant from the first liquid medium into the planar surface; depositing a dielectric material on the planar surface in the gap; selectively removing the first quantity and the second quantity from the planar surface; depositing an electrical contact on each of the first portion and the second portion; and depositing a further electrical contact on the dielectric material.

According to another embodiment of the present specification there is provided an electronic device comprising: a substrate; a semiconductor particle formed separately from the substrate and then fixed upon the substrate; the semiconductor particle planarized to remove portions of the semiconductor particle and to expose at a cross-section of the semiconductor particle a planar surface; and a controllable gated electronic component on or directly beneath the planar surface. The controllable gated electronic component is formed by: depositing a first quantity of a first liquid medium comprising a dopant on a first portion of the planar surface and depositing a second quantity of the first liquid medium on a second portion of the planar surface, the first quantity spaced from the second quantity by a gap; heating the first quantity, the second quantity, and the semiconductor particle, the heating configured to cause diffusion of at least some of the dopant from the first liquid medium into the planar surface; depositing a dielectric material on the planar surface in the gap; selectively removing the first quantity and the second quantity from the planar surface; depositing an electrical contact on each of the first portion and the second portion; and depositing a further electrical contact on the dielectric material.

According to another embodiment of the present specification there is provided a method of forming an electronic device on a substrate, the method comprising: providing a semiconductor particle formed separately from the substrate; immovably fixing the semiconductor particle to the substrate; after the immovably fixing, depositing a first quantity of a first liquid medium comprising a dopant on a first portion of a surface of the semiconductor particle and depositing a second quantity of the first liquid medium on a second portion of the surface, the first quantity spaced from the second quantity by a gap; heating the first quantity, the second quantity, and the semiconductor particle, the heating configured to cause diffusion of at least some of the dopant from the first liquid medium into the surface; depositing a dielectric material on the surface in the gap; selectively removing the first quantity and the second quantity from the surface; depositing an electrical contact on each of the first portion and the second portion; and depositing a further electrical contact on the dielectric material.

The method can further comprise: before the depositing the first quantity and the second quantity, forming a barrier island on the surface in the gap; and before the depositing the dielectric material, selectively removing the barrier island from the surface.

Forming the barrier island can comprise: depositing a third quantity of a second liquid medium comprising a barrier material on the surface in the gap.

Forming the barrier island can comprise: depositing a layer of a photo-reactive material on the surface; exposing a region of the photo-reactive material overlaying the gap to a light configured to modify the photo-reactive material; and selectively removing unexposed regions of the layer of the photo-reactive material from the surface, thereby forming the barrier island comprising the photo-reactive material modified by the light.

The depositing the dielectric material can comprise: depositing a fourth quantity of a third liquid medium comprising the dielectric material on the surface in the gap.

The fourth quantity can wet the first quantity and the second quantity at a wetting angle smaller than about 90°.

The heating can also selectively remove the barrier island from the surface.

The depositing the first quantity and the second quantity can comprise: depositing an initial quantity of the first liquid medium on the surface, the initial quantity covering the first portion of the surface, the second portion of the surface, and the barrier island disposed between the first portion and the second portion; and heating the initial quantity to reduce a volume of the initial quantity by at least partially evaporating one or more components of the first liquid medium, thereby exposing the barrier island and forming the first quantity and the second quantity separated from one another by the barrier island.

The surface can comprise a planar surface.

The planar surface can comprise a planarized surface of the semiconductor particle.

The first quantity can be spaced from the second quantity by the gap in a range of about 0.1 µm to about 100 µm.

Printing can be used for one or more of: the depositing the first quantity; the depositing the second quantity; the depositing the dielectric material; the depositing the electrical contact on each of the first portion and the second portion; and the depositing the further electrical contact.

The printing can comprise one or more of screen printing; flexography; gravure; stamping;
offset printing; and inkjet printing.

According to another embodiment of the present specification there is provided a method of forming an electronic device, the method comprising: providing a semiconductor substrate having a surface comprising a first portion and a second portion, the first portion spaced from the second portion by a gap; forming a barrier island on the surface in the gap; depositing a first quantity of a first liquid medium comprising a dopant on the first portion of the surface and a second quantity of the first liquid medium on the second portion of the surface, the first quantity separated from the second quantity by the barrier island; heating the first quantity, the second quantity, and the semiconductor substrate, the heating configured to cause diffusion of at least some of the dopant from the first liquid medium into the surface; selectively removing the barrier island from the surface; depositing a dielectric material on the surface in the gap; selectively removing the first quantity and the second quantity from the surface; depositing an electrical contact on each of the first portion and the second portion; and depositing a further electrical contact on the dielectric material.

The forming the barrier island can comprise depositing a third quantity of a second liquid medium comprising a barrier material on the surface in the gap.

The forming the barrier island can comprise: depositing a layer of a photo-reactive material on the surface; exposing a region of the photo-reactive material overlaying the gap to a light configured to modify the photo-reactive material; and selectively removing unexposed regions of the layer of the photo-reactive material from the surface, thereby forming the barrier island comprising the photo-reactive material modified by the light.

The depositing the dielectric material can comprise: depositing a fourth quantity of a third liquid medium comprising the dielectric material on the surface in the gap.

The fourth quantity can wet the first quantity and the second quantity at a wetting angle smaller than about 90°.

The heating can also selectively remove the barrier island from the surface.

The depositing the first quantity and the second quantity can comprise: depositing an initial quantity of the first liquid medium on the surface, the initial quantity covering the first portion of the surface, the second portion of the surface, and the barrier island disposed between the first portion and the second portion; and heating the initial quantity to reduce a volume of the initial quantity by at least partially evaporating one or more components of the first liquid medium, thereby exposing the barrier island and forming the first quantity and the second quantity separated from one another by the barrier island.

The surface can comprises a planarized surface of the semiconductor substrate.

Printing can be used for one or more of the depositing the first quantity; the depositing the second quantity; the depositing the dielectric material; the depositing the electrical contact on each of the first portion and the second portion; and the depositing the further electrical contact.

BRIEF DESCRIPTION OF THE DRAWINGS

Exemplary embodiments of the invention will now be described in accordance with the drawings in which:

FIGS. 14a through 14g show steps in another method of forming an electronic device on a semiconductor substrate.

DETAILED DESCRIPTION OF THE INVENTION

Figure 1:
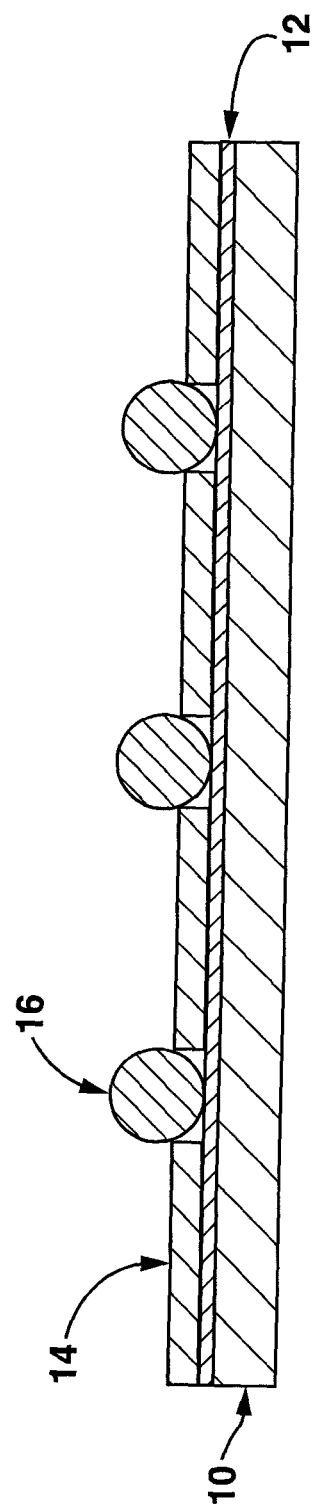
FIG. 1 is a cross-sectional view of an array of semiconducting spheres placed adhesively upon a substrate so as to permanently affix the spheres at predetermined locations.

Turning now to FIG. 1 a substrate 10 is shown which may be plastic, glass, semiconductor material or any other suitable stable material for supporting an electronic circuit. An adhesive layer 12 is applied to an upper surface of the substrate 10 which has a grid 14 having predetermined gaps between grid elements suitably sized to contain semi-conducting spheres 16, having a diameter of less than 15 mm and preferably less than 2 mm. The term semiconducting sphere, used hereafter, is to include spheres, spheroids and semiconducting sphere-like objects which may have imperfections, due to defects in forming the spheres. The arrangement shown in FIG. 1 conveniently allows a circuit designer to have a great deal of control in determining where spherical semiconducting material is to be located, and as a result, where semiconductor devices residing on planar surfaces of the spheres 16 are to be fabricated after the spheres are planarized. Although the grid is shown with same spacing between grid openings, a grid having non-uniform spacing can be used to locate spheres in any desired pattern. If the electronic devices were fabricated on the planar surfaces prior to positioning the spheres on the substrate, orienting the spheres would be very difficult. Therefore, the semiconducting spheres 16 are first fixedly attached to the substrate 10 and are subsequently planarized so as to expose regions of high-quality semi-conductor material within the interior of the sphere suitable for fabrication of silicon electronics; by way of example, CMOS devices can be formed at the planar layer by doping the material of the sphere at the planar layer and beneath. Spherical particles are described in detail and are particularly convenient to position and planarize, however many other particle shapes can be used, as long as the particles can be positioned and secured to a substrate conveniently and as long as the particles can be planarized so as to provide a surface on which to fabricate electronic devices.

Typically, for most chip-based electronics, the unused chip area is reduced to a minimum so the device density is high. The density is so high, that the unused substrate area wasted by not having an active device fabricated thereon is small. In displays and imagers, the device area is specified by requirements that are not electronic. As a result, as the displays become larger, the device density becomes lower. At some point, coating several square meters with low-quality Si to make a few devices, or a few million compared to 100 s of millions in a PC CPU, is no longer desirable. In accordance with this invention, high-quality Si is placed only where it is needed, thereby covering a lower fraction of the total display area for large displays. This technological inflection point should occur as a result of the impending crossover to faster OLED devices. OLEDs are current devices, and amorphous silicon on glass cannot deliver the required current and speed.

Silicon spheres have been used previously to manufacture large area photo-voltaic panels as described in U.S. Pat. No. 4,614,835 Photovoltaic Solar Arrays Using Silicon Microparticles, Filed Dec. 30, 1983, in the names of Carson et al, incorporated herein by reference. For photo-voltaic applications the surface of the sphere forms the active area. Silicon spheres can be made from low cost powdered silicon and the resulting re-crystallized surface layer of silicon dioxide can getter significant impurities. Repeated melting cycles can improve the overall material purity. Even in the case of poly-crystalline particles, the electron mobility is many times that of amorphous silicon.

In accordance with this invention, it was discovered that for electronic devices, it is preferable to fabricate devices using the flat surface of a cross section of a semiconductor particle such as a sphere rather than the curved outer surface. The flat surface allows the use of standard lithography techniques, allowing the fabrication of transistors, interconnects, etc. For example, a silicon sphere 20 microns in diameter, provides a maximum area, $A=\pi \times r^2=\sim 314$ microns$^2$ for device fabrication. Many transistors with gate lengths on the order of 1 micron can be fabricated within such an area For large area displays, only a few transistors are required for each pixel and pixel size does not scale with display size; High Definition (HD) is a standard resolution (e.g. 1920×1080 pixels). In addition, one flat area of high quality, single-crystal silicon can service more than one pixel, as well as provide added functionality such as self-test and display performance monitoring and correction.

The use of the flat cross section of a planarized particle such as a truncated planarized sphere allows the use of standard photolithographic fabrication techniques. Furthermore, by planarizing, imperfections that occur on the surface of the sphere or spheroid are removed as the sphere or spheroid is etched or polished to expose the inner region. Conveniently, because the spheres are purified in a separate process, high-purity single-crystal material can be realized using high temperature processes not available to amorphous silicon on glass substrates as the glass substrate melts at temperatures lower than standard silicon processing temperatures. This is even more important for lower melting temperature substrates such as plastics. Truncated spheres or planarized particles of other shapes can be doped, or multiply doped just below or above their planar surface to form rings of n-type and p-type material or "wells" when the cross section is exposed; doping can also occur later in the process. This will allow the fabrication of CMOS devices as is shown in FIG. 5. Although the preferred way in which to dope a region is by ion-implantation, doping can also be achieved by spin-coating dopants onto the planarized surface. The outer surface can be highly doped or metallized to form a substrate contact that can be contacted from either the edge of the top surface or from anywhere on the spherical surface, which is the effective backside. The term contact used in this specification can be a physical wire, or a metallized contact region such as a conductive contact pad whereby a lead or wire or device can make electrical contact.

The present invention provides spherical silicon particles at known locations on a substrate, which is preferably a non-silicon substrate. Positioning the silicon spheres on a substrate can be done by any of several techniques. Most involve patterning the substrate with a plurality of locations in which spheres are to be placed. Metal or dielectric grids can be permanently or temporarily applied to the substrate first, or standard photolithographic techniques can be used Alternatively dots, dimples, or other patterns of adhesive can be applied to locate the spheres. Adhesive material with a melting point or adhesive at room temperature appropriately matched to subsequent electronic processing should be chosen.

As an alternative to a deposited or applied grid, the substrate can be patterned directly, using standard lithographic techniques to make holes in the substrate in which to deposit adhesive for fixing the semi-conductor spheres. In some embodiments, a fireable ceramic material can be used as the substrate. Holes can be made in the green, i.e. unfired, ceramic using techniques including, but not limited to, punching or drilling.

In another embodiment, silicon particles can be used to form a monolayer on the substrate surface in substitution for non-semiconducting spheres used to form a mask, described in U.S. Pat. Nos. 6,464,890, and 6,679,998 Knappenberger et al. filed Aug. 29, 2001 and August 23 respectively, incorporated herein by reference. As long as the particles are a predetermined size, then subsequent processing can provide for planarized silicon particles such as spherical particles in the required locations.

In FIG. 1 an exemplary technique is shown whereby a metal grid 14 is used with an adhesive layer 12. Spheres 16 are subsequently placed on the surface in sufficient quantity such that the use of mechanical vibration to move the spheres around on the grid results in complete occupation of the grid openings. The mechanical vibration causes the silicon spheres 16 to move around the volume defined by the substrate, walls and a cover. In a very short time, the spheres 16 move around to such a degree that the probability of encountering an available grid location is unity, as long as spheres are still available. It is contemplated that other types of mechanical agitation can be used instead of and/or in addition to vibration. For example, the substrate, with the spheres placed on it, can be rotated about one or more axes and/or translated in one or more directions.

Figure 2:
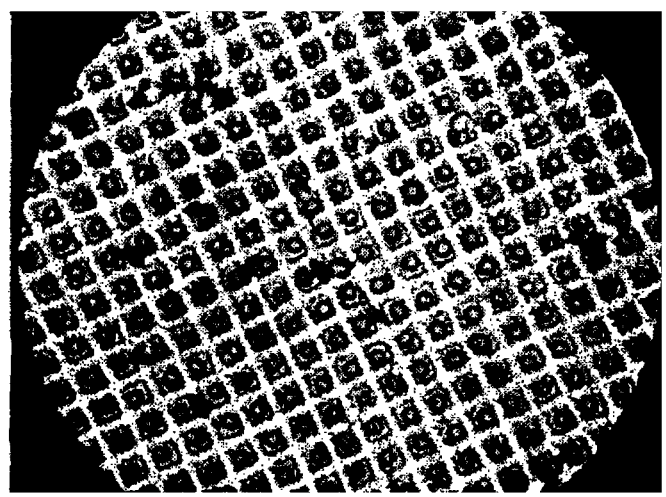
FIG. 2 is a photograph of an array of glass spheres disposed upon a non-silicon substrate.

FIG. 2 shows a photomicrograph of such a device made on a glass substrate with a grid. In this exemplary case, glass spheres are used and are 20 microns in diameter. Mechanical vibration was used to move the glass spheres around on the grid. High voltage (V≤12 kV) was then applied to the grid to help remove spheres from the top surface of the grid. Some excess spheres and dirt can also be seen, but these would be reduced or eliminated in a clean room environment and/or removed in subsequent processing steps.

For large areas, spheres can be applied in a dense line across the surface in one direction and then vibrated across the surface of the substrate in a wave. In some embodiments, semi-conductor particles can be placed on the surface of the substrate to substantially or entirely cover the surface of the substrate before mechanically agitating the substrate and the semi-conductor particles.

It is contemplated that similar techniques, using mechanical agitation, can be used, whereby the substrate comprises through holes at predetermined positions for at least partially receiving the semi-conductor particles. A layer of adhesive can be applied to one face of the substrate, with the adhesive layer covering one end of the through holes. The semi-conductor particles can be placed on the other face of the substrate, opposite the face bearing the adhesive layer, and then the substrate and the semi-conductor particles can be mechanically agitated to cause the semi-conductor particles to at last partially occupy the holes in the substrate. The semi-conductor particles can adhere to the portions of the adhesive layer accessible through the holes, and as a result be retained and/or secured in the holes. The adhesive layer can comprise glass paste or other suitable adhesive known to the skilled person.

Alternatively, electric fields can be applied using external electrodes in order to move the particles on the substrate as described in "Mechanics of a process to assemble microspheres on a patterned electrode," Ting Zhua, Zhigang Suob, Adam Winkleman and George M. Whitesides, APPLIED PHYSICS LETTERS 88, 144101 (2006), hereafter referred to as reference 1. In this approach an electric potential is created using a bottom electrode placed underneath the dielectric substrate and the conductive grid is used as the counter electrode. The holes in the grid create a potential well that the spheres can drop down into The electric field gradient around the hole is sufficient to create a net force acting on the particle. For large enough applied fields (KV), the particles can be moved into the holes. Vibration may be required initially, to move the spheres around so that they encounter the potential well.

In another approach, a similar process to that used in laser printing can be utilized. In laser printers, triboelectrically generated charge is applied to toner particles. The charged toner particles are then applied to an electrostatically charged (drum) substrate. In laser printing the toner particles are then transferred to an electrostatically charged substrate typically paper. In laser printing the laser is used to write the pattern on the charged drum, but since the pattern wouldn't change in a production environment, the laser can be replaced by a grid. In first generation laser printers, toner particle size of approximately 16 microns was on the same order as the spheres of FIG. 2. By applying a voltage to an electrode underneath the dielectric substrate to attract the charged spheres, and the opposite polarity to the grid, the spheres are selectively attracted to the holes. This approach can be viewed as an enhancement of the approach described in reference 1.

In an alternative embodiment of the present invention, the array of spheres could then be transferred from the first substrate, acting similarly to laser printer drum, to another, un-patterned substrate, acting similarly to the charged paper, in a complete analogy to laser printing described.

Alternatively, transferring of the array from first to second substrates can also be accomplished if the adhesive on the second, un-patterned substrate, or adhesive applied to the spheres has a higher melting temperature, greater adhesion or electrostatic attraction, for example. While the exemplary device of FIG. 1 uses an adhesive layer, the substrate or grid under layer can be a heat-softened layer, such as thermoplastic layer at elevated temperature so the spheres adhere on contact and remain in place when the substrate is cooled to ambient temperature. The adhesive can be a thin layer applied to substrate. The relatively small size of the spheres means that significant contact area is achieved for a small layer thickness of adhesive.

Since silicon has a higher melting temperature than glass, a glass substrate can be used directly if sufficiently heated to soften the glass and so allow the spheres, either coated with silicon dioxide or stripped of oxide, to adhere directly to the glass, providing an assembly that can be subjected to higher post-processing temperatures. This can be accomplished by transferring the arrayed particles from a patterned substrate onto un-patterned glass using electrostatic attraction, as in laser printing. By fixing the particles directly to the glass the window for higher temperature processing can be extended to the point where the cross sectional interior of the semiconducting spheres is exposed. The same printing process can be used for other substrates.

Figure 3A:
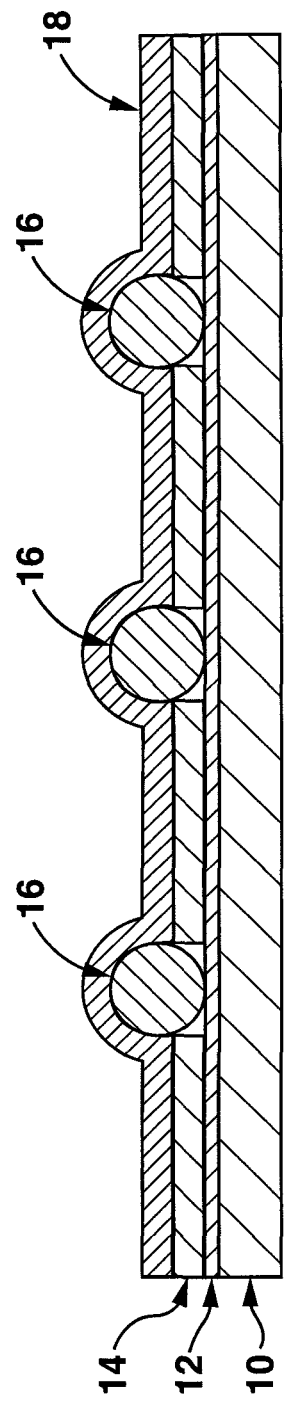
FIG. 3a is a cross-sectional view of semiconducting spherical particles deposited on a gridded substrate having a conformal coating deposited on top of the spherical particles.
Figure 3B:
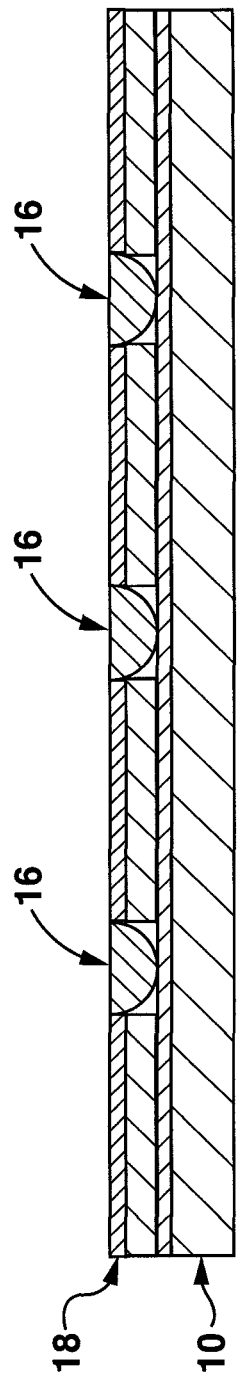
FIG. 3b is a cross-sectional view of the semiconducting spherical particles shown in FIG. 3a after being planarized.

Once the spheres 16 are in place, a conformal coating 18 is applied and subsequently planarized using a modification of the standard planarization techniques, such as chemo-mechanical polishing, as shown in FIG. 3a where the coating layer 18 of $SiO_2$ is shown covering the spherical particles 16 and the grid 14. FIG. 3b shows the same array of FIG. 3a after planarization and before devices are fabricated on the truncated spheres in the form of hemispheres. Standard planarization techniques used in integrated circuit fabrication can be utilized. Planarization can occur multiple times in the process because as multiple layers are deposited sequentially, the topography can exceed that supported by the process, therefore after a conformal dielectric coating is applied it is then planarized; and when a conductive coating is applied it is then planarized. Connections between layers are made by opening holes or vias at lithographically defined locations and depositing conductive connections or plugs between layers. This is particularly advantageous. In the case of a planarized metal layer, the layer would be patterned to form the required interconnects. In the present invention, the process of planarization is performed to expose the interior cross-section of the semiconductor particles, as opposed to the prior art of planarizing the surface without exposing all of the underlying elements, as described in U.S. Pat. No. 4,470,874, entitled Planarization of multi-level interconnected metallization system, filed Dec. 15, 1983, incorporated herein by reference.

Although the silicon spheres are placed with random orientation, the anisotropy of mobility in Si is small, so the resulting devices that are fabricated will be much higher performance than those made using amorphous- or poly-silicon. However, if the application is less demanding and for example does not require high-speed devices, then poly-silicon or non-spherical particles can be used While spherical particles are preferred, powdered silicon can be used, either single- or poly-crystal, if appropriate to the performance requirements of a particular application. In addition, multiple placement cycles can be used to place particles of different sizes, or different material characteristics, such as doping or crystalline quality or atomic species, such III-V, for example GaAs, or quaternary alloys for use as optical sources, or SiGe, to realize different functionality in the final device.

Figure 5A:
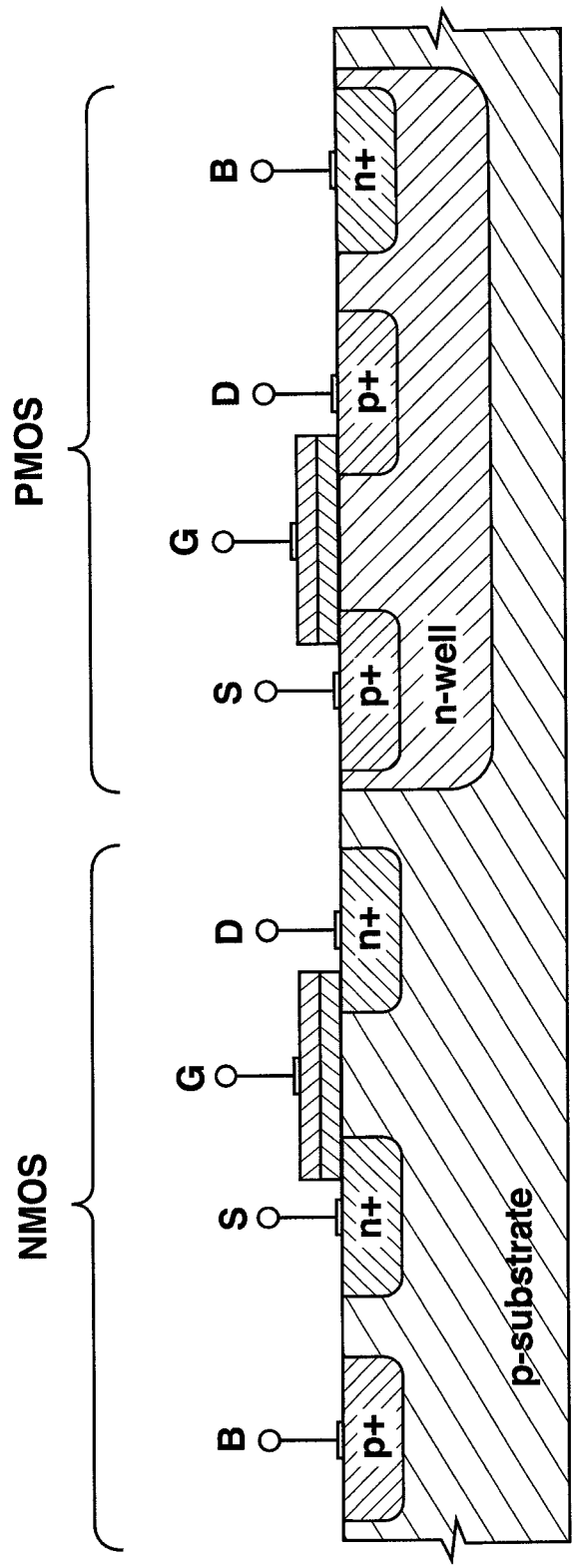
FIG. 5a is a partial cross-sectional view of complementary NMOS and PMOS circuits formed on a planarized semiconducting particle doped with a p-type material when forming the particle.
Figure 5B:
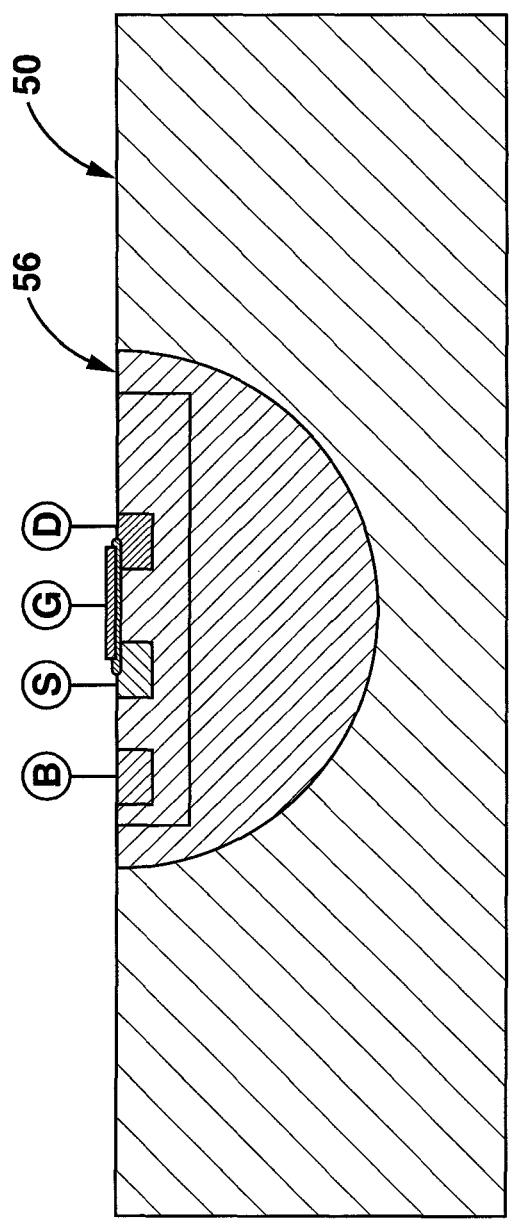
FIG. 5b is a cross-sectional view of a single transistor device fabricated within a single planarized sphere.

Standard photolithographic techniques are used to fabricate devices on the exposed silicon surfaces as well as fabrication of interconnects and other elements required for device functionality. The present invention allows for nearly conventional CMOS devices to be fabricated; and, it may be advantageous to utilize other processes. The present invention does not intrinsically restrict the type of process that can be used. For example, particles of n and p type silicon can be deposited in separate steps, to achieve n- and p-wells using separate silicon particles. In conventional CMOS, the n-well shown in FIG. 5a must be fabricated within the global p-type substrate. Turning now to FIG. 5b, a device similar to that of FIG. 5a is shown fabricated within a spherical particle that is doped with a p-type material for form a p-type sphere. In this figure a semi-spherical semiconductor device 50 is shown wherein a planarized sphere 56 forms a gated semiconductor transistor device having a source (S), drain (D) and Gate (G) as well a contact B which forms a substrate bias as the device is within a doped well, as shown. In this instance a single device is formed within the planarized semiconducting sphere. Each of the lines extending from the device to B, S, D, and G are electrical contacts. The number of separate devices that can be manufactured on within/upon a single crystal particle depends greatly on the size of the planarized region. For example if the device has a 1 μm gate length and 1 μm via holes, the entire device maybe 5 μm×5 μm device. However, a sphere with a 20 μm diameter would have a surface area of greater than 300 $\mu m^2$ which could accommodate several devices. By way of example a 2×2 pixel array or a single pixel with additional circuitry for example for lifetime-control could be inbuilt. Considerations of sphere size would be cost, reliability and yield. The device shown in FIG. 5a could be fabricated on any or all of the planar spheres shown for example in FIG. 3b.

Figure 5C:
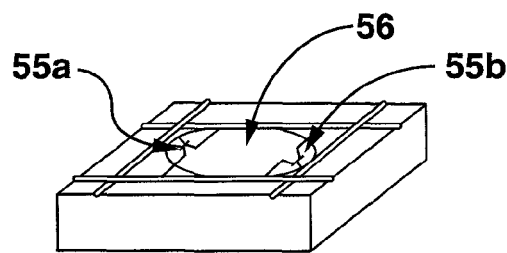
FIG. 5c is an isometric view of a circuit with symbolic representation of gated transistors shown in a planarized spherical particle. This single cell could also form a standalone circuit, be packaged and function as a standalone device, replacing a similar device fabricated on a silicon wafer.
Figure 5D:
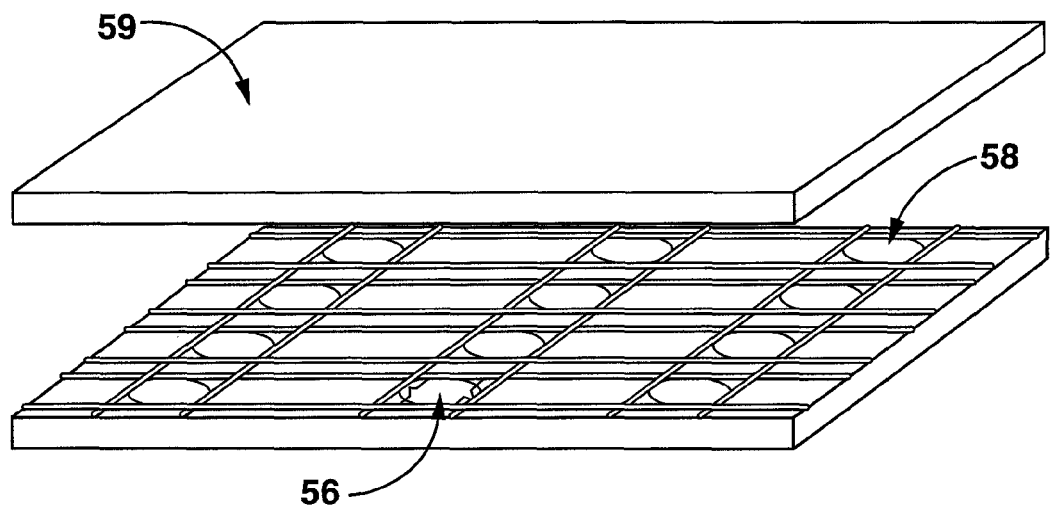
FIG. 5d shows the spherical particle of FIG. 5b illustrating that an array of such particles can be manufactured in adjacent particles not shown to have transistors therein.
Figure 6A:
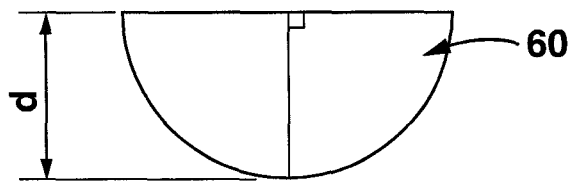
FIGS. 6a through 6d are cross-sectional views of particles wherein the maximum depth is shown normal to a planarized surface.
Figure 6B:
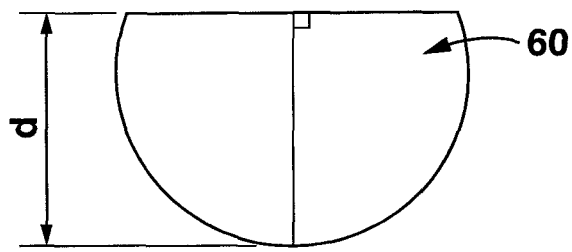
Figure 6C:
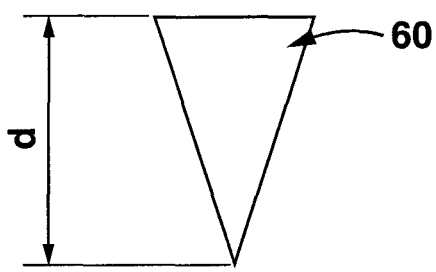
Figure 6D:
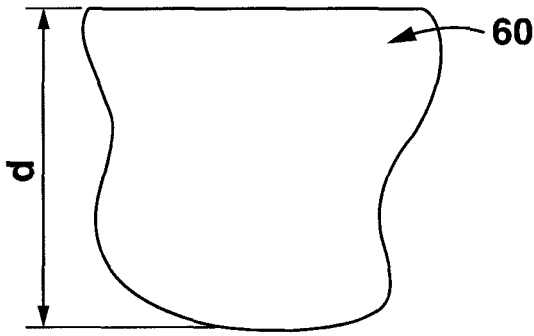

A symbolic representation of transistors 55a 55b is shown in FIGS. 5c and 5d. Further doping occurs to achieve the NMOS and PMOS devices in the same sphere. In FIG. 5c an array of controllable functional devices such as transistors can be fabricated. Although not shown in the array 58 of planarized spheres 56, an array of devices would be manufactured within the same process. That is, doping would be done to all transistors at the same time. A passivation layer 59 is applied directly over top of the planarized spheres after devices are fabricated. The layer 59 is shown before it is laid down over the active devices. Although an advantage of this invention is that an array of any size can be manufactured it may be desired to cut up the array into smaller functional units which can be placed in desired locations. Current means for cutting silicon wafers can be used in this instance.

The resulting electronic assembly can then be used as the basis for a variety of devices such as displays, or imagers.

In accordance with an aspect of this invention non-glass substrates, such as plastic, Mylar, polyimide or other application appropriate material, can also be used, allowing not only decreased cost of production, but also the realization of both flexible and moldable devices. As the dimensions of the semiconductor particle are reduced, the minimum bend radius is also reduced. For silicon particles, which are smaller than the substrate thickness, the mechanical properties will be largely dictated by the non-silicon elements of the device and so can be made either flexible or moldable or a combination thereof. Devices can also be fabricated where the mechanical properties vary throughout the device, where the mechanical stiffness is specified as a function of position within the device.

In a further variation of the present invention, large substrates can be cut to form small devices, in the same way that silicon wafers are cut into devices of a preferred size; the device is small relative to the substrate. The present techniques would applicable where the costs and performance allowed the use of non-silicon substrates. In many silicon devices for example, the area occupied by the contact pads and interconnects can be on the same order as the device area. In other applications, device performance can be enhanced by using a substrate with a large thermal conductivity. Here the spherical backside of the particle provides a larger surface through which heat can be removed.

Figure 4A:
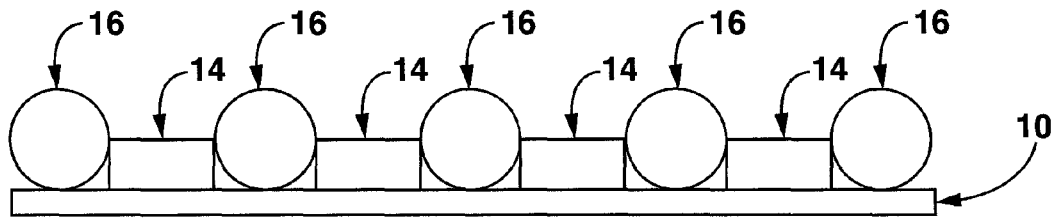
FIGS. 4a through 4f show the method of forming contacts on the planar surface and to the outside surface of a sphere for example, for providing an array of solar cells.
Figure 4B:
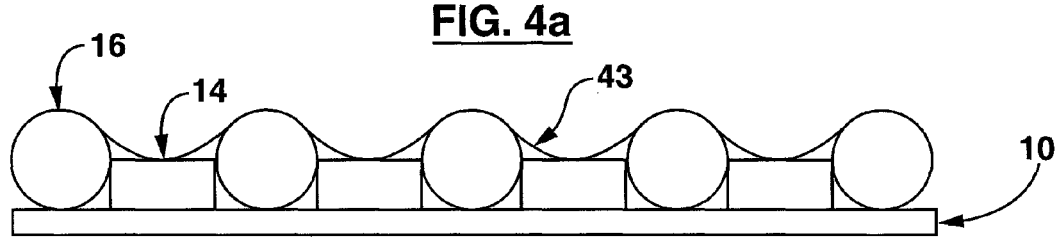
Figure 4C:
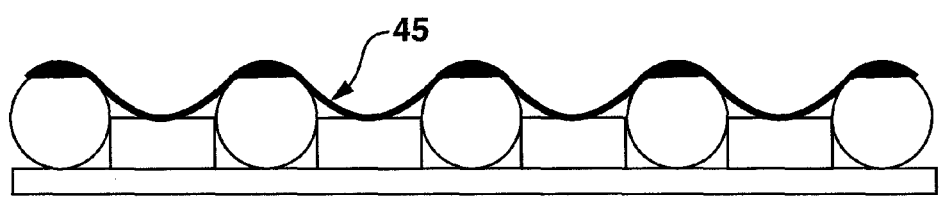
Figure 4D:
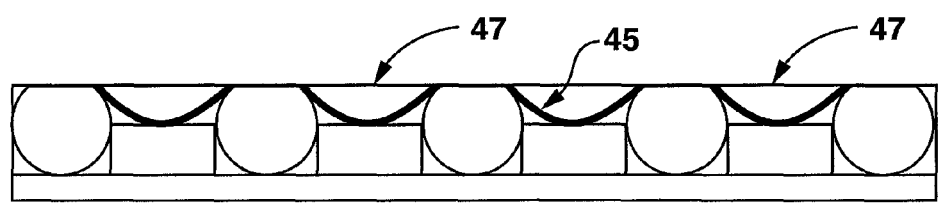
Figure 4E:
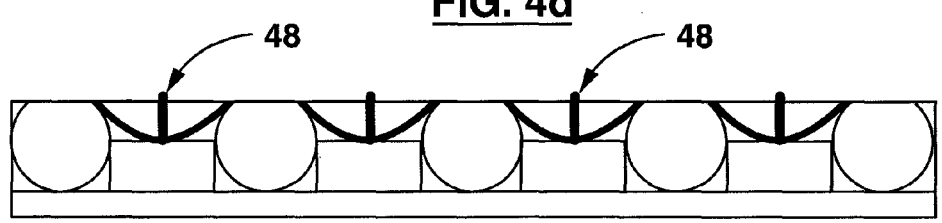
Figure 4F:
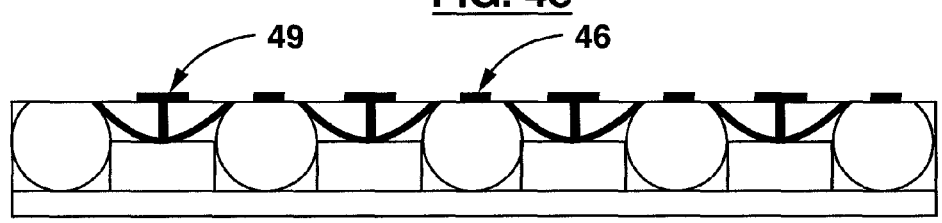

As was mentioned heretofore, this invention also allows for the manufacture of solar cells using a similar fabrication method. Turning now to FIGS. 4a through 4f a process of manufacturing solar cells is shown, wherein spheres 16 doped with p-type material shown in FIG. 4a are located in openings with a grid 14 and are fixed to the light transmissive substrate 10 they are supported by. In FIG. 4b the spheres and grid are coated in a layer 43 of $SiO_2$ and in FIG. 4c a metallization layer 45 is applied. In FIG. 4d the structure is planarized and the spheres have planar upper surfaces 47. In FIG. 4e vias and conducting plug formation 48 is provided. Also not shown in FIG. 4e, the planar region just below the planar surface is doped with n-type material and in a subsequent step in FIG. 4f interconnects 46 and 49 are formed so that all interconnects are on the planar upper surface which contact the p and n material. This upper planarized surface actually forms the backside of the solar panel.

The term planarized particle or particle having a planar surface refers to particles in a preferred embodiment that have a longest dimension across the planar surface of 15 mm and a depth (d) of at least 1 µm normal to the planar surface. Preferably these particles are spheres, spheroids or imperfect spheres or spheroids. However other particle shapes are within the scope of this invention. FIGS. 6a through 6d illustrate various particle shapes 60 and show depth (d) normal to the planar surface of the particle.

Arrays of electronic devices fabricated according to the foregoing description, including but not limited to the electronic device shown in FIG. 5d, can be used as backplanes for active matrix electro-optical devices. These electro-optical devices can include, but are not limited to, displays and imagers. In these devices, the controllable gated electronic components fabricated on and/or beneath the planar surfaces at the planarized cross-sections of the semiconductor particles can be electrically connected to one or more pixels of the optical portion of the electro-optical device. The optical portion can comprise a light-emitting portion in the case of a display and/or a light-detecting portion in the case of an imager. The controllable gated electronic devices, including but not limited to transistors, can be used to control and/or power the light-emitting pixels in the case of a display, and/or to sample the electrical signal from light-detecting pixels in the case of an imager.

Figure 7:
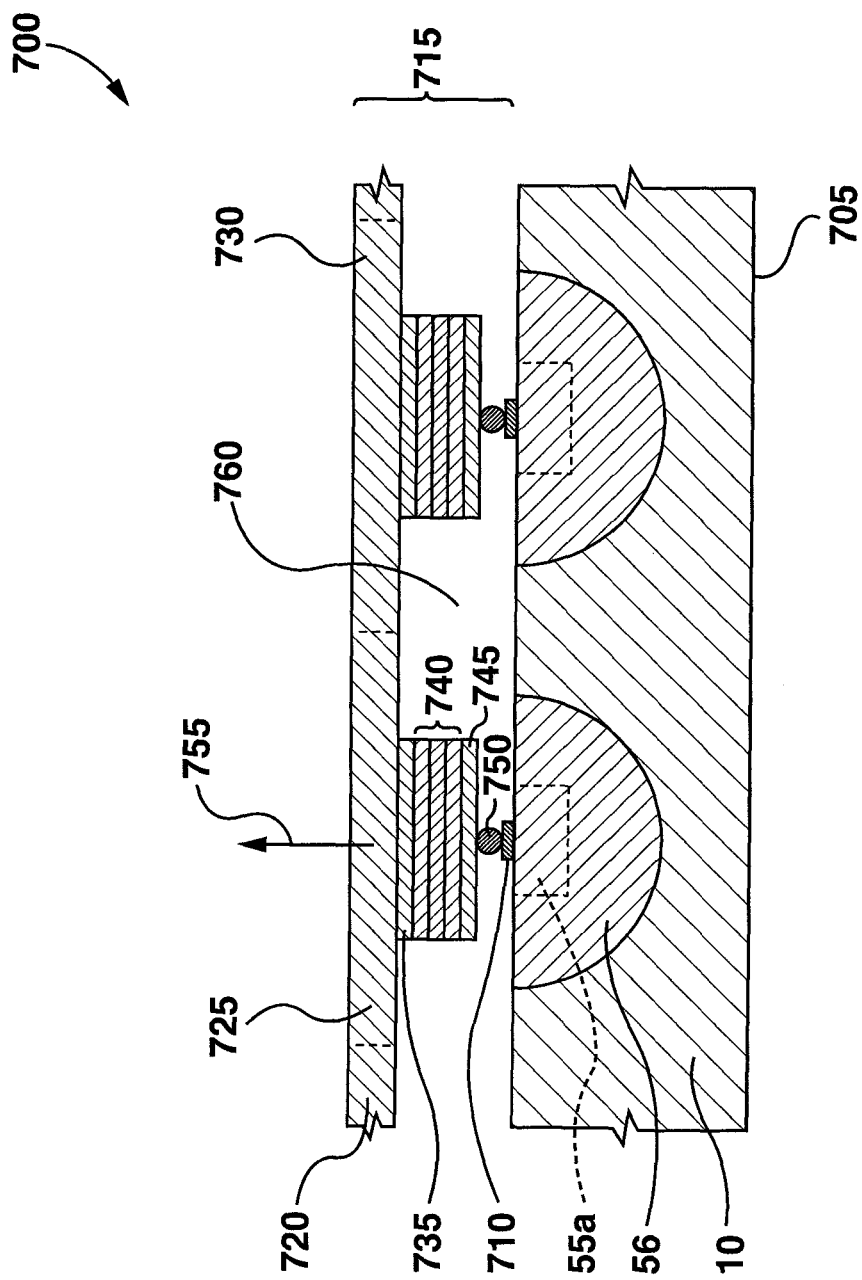
FIG. 7 shows a cross-section of an active matrix display.

FIG. 7 shows a schematic representation of a cross-section of a display 700, comprising a backplane 705 electrically connected to a light emitting assembly. The light emitting assembly can include, but is not limited to, an organic light emitting diode (OLED) assembly 715, in which case display 700 can be an active matrix OLED display. While the following description refers to OLED assemblies, it is contemplated that the light emitting assembly can be any suitable electroluminescent assembly known to the skilled person.

The backplane assembly for display 700 can comprise planarized semiconductor particles, such as planarized spheres 56, secured to substrate 10. Substrate 10 will henceforth be referred to as "backplane substrate 10". For the purposes of this description, substrate 10 and backplane substrate 10 can be interchangeable. One or more controllable gated electronic components, including but not limited to transistor 55a, can be formed on and/or beneath the planar surface at the planarized cross-section of planarized spheres 56. While in FIG. 7 only one transistor 55a is shown per planarized sphere 56, two or more controllable gated electronic components can be formed on and/or beneath the planar surface at the planarized cross-section of one or more of the semiconductor particles of backplane 705. The controllable gated electronic components can also be of different types and designs, including but not limited to different varieties of transistors. The controllable gated electronic components can also comprise any lithographically patterned circuit element. The following description refers to transistor 55a, but it is contemplated that any type and/or variety of suitable circuit element and/or electronic component known to the skilled person can be used instead of and/or in addition to transistor 55a.

Contact 710 can be formed on and/or beneath the planar surface at the planarized cross-section of planarized spheres 56. Contact 710 is in electrical contact with transistor 55a. In addition and/or alternatively, contact 710 can be in electrical contact with one or more other circuit elements and/or combinations of circuit elements. Such circuit elements can include but are not limited to capacitors. While in FIG. 7 only one contact 710 is shown for transistor 55a, it is contemplated that two or more contacts can be formed for each transistor, according to the design of the transistor and/or the number and types of connections needed between transistor 55a and pixels of OLED assembly 715. Contact 710 can comprise a deposited layer of a conductive material, including but not limited to a metallic material. In addition and/or alternatively, contact 710 can comprise: metal filled epoxies including but not limited to silver epoxy, carbon filled epoxy, and low temperature solders comprising indium or indium-tin alloys.

OLED assembly 715 can comprise OLED substrate 720 and one or more organic light emitting layers 740 in contact with one or more electrodes. In one embodiment, OLED assembly 715 can comprise one or more pixel regions 725,730. One or more of pixel regions 725,730 can comprise a first electrode 735 deposited on OLED substrate 720, one or more organic light emitting layers 740 deposited on first electrode 735, and a second electrode 745 deposited on one of the organic light emitting layers 740 to sandwich at least one of the organic light emitting layers 740 between first electrode 735 and second electrode 745. While FIG. 7 shows each pixel region 725,730 having its own stack of first electrode 735, organic light emitting layers 740, and second electrode 745, it is contemplated that one or more of the first electrode 735 and organic light emitting layers 740 can span multiple pixel regions. While a particular architecture and geometry of OLED assembly 715 is shown and described, it is contemplated that different architectures and geometries of OLED assembly 715 known to the skilled person can also be used for display 700.

OLED substrate 720 can comprise a material at least partially transparent to the light emitted by organic light emitting layers 740. OLED substrate 720 can comprise materials including but not limited to glass, plastic, and polyimide. First electrode 735 can comprise an electrically conductive material at least partially transparent to the light emitted by organic light emitting layers 740. First electrode 735 can comprise indium tin oxide (ITO). In some embodiments, OLED substrate 720 can function also as the first electrode. Second electrode 745 can comprise a layer of conductive material, including but not limited to aluminum and/or copper.

Adjacent pixel regions 725,730 can be distinguished from one another by one or more of separate first electrodes 735, separate organic light emitting layers 740, and/or separate second electrodes 745. In some embodiments, one or more of pixel regions 725,730 can each have two or more distinct second electrodes, which can act as pixel contacts for their respective pixel region. In FIG. 7, dotted lines across OLED substrate 720 demarcate the approximate boundaries of each pixel region 725,730. These dotted lines are for illustration purposes, and do not necessarily represent a physical feature of OLED assembly 715.

An active matrix OLED display can be formed by electrically connecting backplane 705 to OLED assembly 715 such that at least one of the pixel regions 725,730 is electrically connected to corresponding one or more of the controllable gated electronic components, for example, to transistor 55a. In FIG. 7, pixel region 725 is shown as being connected to only one contact 710 of transistor 55a. In other embodiments, others ways of connecting pixel regions to transistors can include, but are not limited to one pixel region can be connected to multiple transistor contacts and/or to multiple transistors; one transistor contact 710 and/or one transistor 55a can be connected to multiple separate second electrodes, i.e. pixel contacts, of pixel region 725; and one transistor 55a can be connected to multiple different pixel regions 725,730.

OLED assembly 715 can be electrically connected to backplane 705 through one or more conductive links 750. Conductive link 750 can connect transistor 55a to a corresponding pixel region 725. Conductive link 750 can comprise an electrically conductive bridge between contact 710 and second electrode 745. Conductive link 750 can comprise a soft and/or flexible conductive link. Conductive link 750 can comprise one or more of a conductive epoxy such as silver epoxy, a solder, and a low temperature solder. In some embodiments, transistor 55a may not have a preformed contact 710, and conductive link 750 can connect second electrode 745 to transistor 55a. In some embodiments, pixel region 725 may not comprise a second electrode 745, and conductive link 750 can connect contact 710 and/or transistor 55a directly to at least one the organic light emitting layers 740.

Using a soft and/or conductive link 750 can reduce the likelihood of conductive link 750 damaging organic light emitting layers 740 and/or the likelihood of conductive link 750 causing an electrical short with first electrode 735 as a result of conductive link 750 breaking through second electrode 745 and organic light emitting layers 740. Using a conductive link 750 that can be applied at relatively low temperatures can reduce the likelihood of thermal degradation and damage to organic light emitting layers 740, which can be temperature sensitive.

Active matrix OLED display 700 can be formed by electrically connecting backplane 705 to OLED assembly 715, using conductive links 750 as described above. In order to enable each pixel region 725,730 to be adjacent its corresponding transistor 55a prior to connecting the two, prior to joining backplane 705 to OLED assembly 715, backplane 705 and OLED assembly 715 can be aligned with each other. The aligning can be performed using optical or physical markers on one or both of backplane 705 and OLED assembly 715. The aligning can also be performed by placing backplane 705 and OLED assembly 715 in a jig that determines their position relative to one another.

When backplane 705 is joined to OLED assembly 715 by conductive links 750, gaps 760 may remain between backplane 705 and OLED assembly 715. These gaps 760 can be partially or completely filled with a backfill material to further mechanically strengthen the connection between backplane 705 and OLED assembly 715. In addition, the backfill material can be opaque, light scattering, and/or light absorbing in order to reduce and/or eliminate any visible reflections from backplane substrate 10 that might interfere with the image generated by the OLED display 700. In some embodiments, the backfill material can be substantially black. Being substantially black can comprise reflecting a sufficiently small portion of the light incident upon the backplane so that this reflected light would not constitute a human-visible interference with the image generated by the OLED display 700.

During fabrication of OLED display 700, backplane 705 and OLED assembly 715 can be formed separately and then joined together. For example, backplane 705 can be formed according to the foregoing description. OLED assembly 715 can be formed separately from backplane 705 and on OLED substrate 720, which is distinct from backplane substrate 10. Forming OLED assembly 715 separately from forming backplane 705 allows each part of the fabrication process to be optimized independently. In addition, this bifurcated fabrication process allows for separate quality control for the OLED assembly process and the backplane fabrication process. A defect in a batch of backplanes 705 or OLED assemblies 715 would affect only that subcomponent, instead of affecting the entire display 700.

In addition, separate fabrication of OLED assembly 715 can allow for better control over formation of the different components of pixel regions 725,730, including organic light emitting layers 740. OLED substrate 720 and/or first electrode 735 can constitute a more suitable substrate, e.g. flatter or smoother, for depositing organic light emitting layers 740 which can be sensitive to unevenness of the substrate they are deposited on More consistent deposition of organic light emitting layers 740 can also reduce the likelihood of punch through electrical shorts, which can be caused by damaged organic light emitting layers 740 that allow electrical contact between first electrode 735 and second electrode 745, conductive link 750, and/or contact 710.

To operate OLED display 700, an electrical potential is applied between first electrode 735 and second electrode 745, thereby applying a potential to organic light emitting layers 740. First electrode 735 can be connected to a transistor, power source, and/or an electrical lead on backplane 705, and/or first electrode 735 can be connected to a power source and/or electrical lead independent of backplane 705. Second electrode 745 can be connected to transistor 55a. One or more of the organic light emitting layers 740 can then emit human visible light which can be emitted through first electrode 735 and OLED substrate 720 and out of OLED assembly 715 in the direction of light emission 755. Transistor 55a can power, and/or control the power applied to, the organic light emitting layers 740 to control emission attributes of pixel regions 725,730 including but not limited to brightness and on/off status.

While FIGS. 7-10 show three organic light emitting layers 740, it is contemplated that fewer or more than three organic light emitting layers can be used When there are multiple organic light emitting layers 740, the layers can comprise different materials.

In some embodiments, each pixel region 725,730 can emit only one color. In other embodiments, pixel regions 725,730 can emit multiple colors. For example, each pixel region 725,730 can have multiple sub-pixel regions each emitting one color. For example, each sub-pixel can emit one of red, green, and blue color light. When pixel regions 725,730 have sub-pixel regions, each sub-pixel region can have its own separate second electrode 745, i.e. its own separate sub-pixel contact. Each sub-pixel region can be controlled by one or more corresponding transistors.

Figure 8:
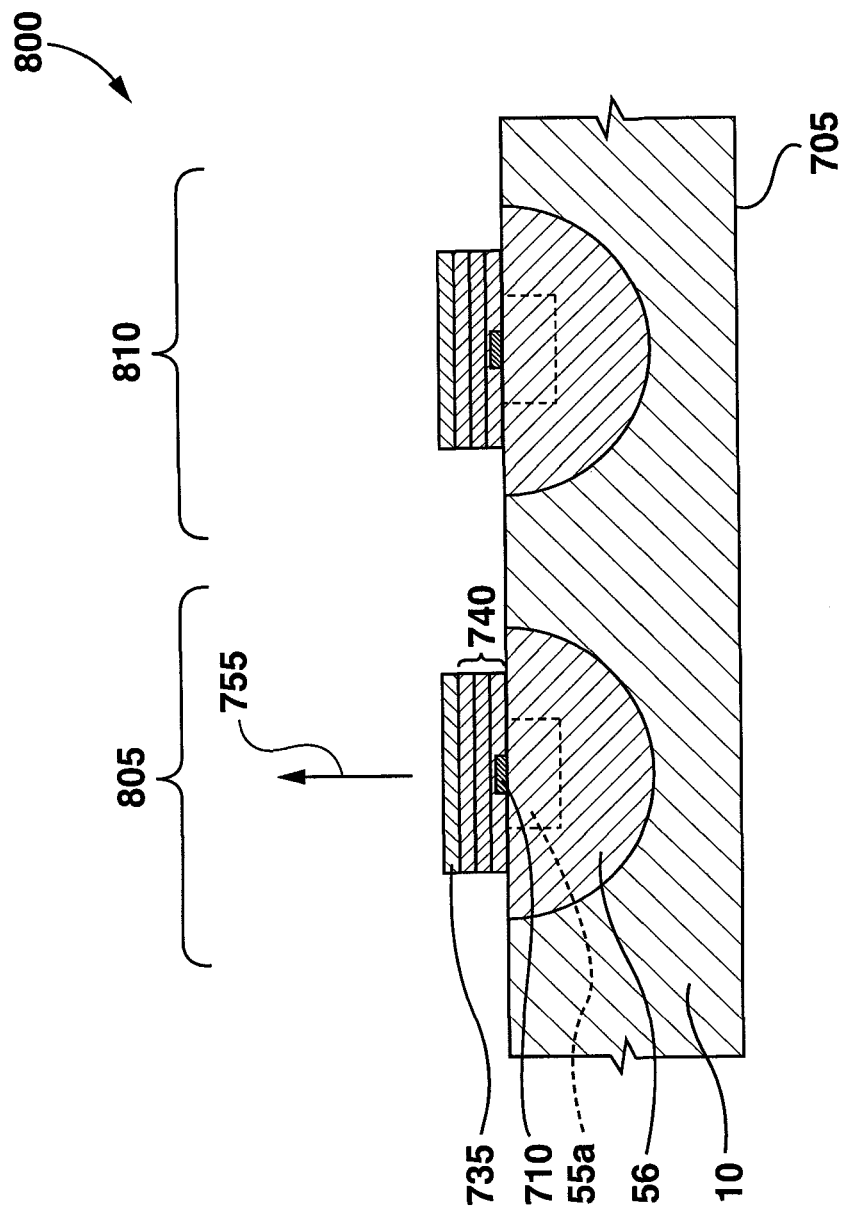
FIG. 8 shows a cross-section of another embodiment of the active matrix display.

FIG. 8 shows a cross-section of active matrix display 800, which can be an active matrix OLED display. Backplane 705 is the same in display 800 as in display 700, and comprises transistors 55a, with contacts 710, formed on and/or beneath the planar surfaces of planarized spheres 56 secured to backplane substrate 10. Display 800 is different from display 700 in that in display 800 the light-emitting assembly is deposited directly onto backplane 705. For example, organic light emitting layers 740 can be deposited directly on planar surface of planarized sphere 56, so that at least one of the organic light emitting layers 740 is in electrical contact with contact 710 of transistor 55a.

First electrode 735 can be deposited onto one of and/or the outer-most of organic light emitting layers 740. While organic light emitting layers 740 and first electrode 735 are shown as forming discrete stacks over each different transistor 55a, it is contemplated that one or more of the organic light emitting layers 740 and/or first electrode 735 can be deposited as a layer spanning multiple transistors 55a.

In some embodiments, organic light emitting layers 740 can be deposited on the surface of backplane substrate 10 outside of the planar surfaces of planarized spheres 56 as well as on the planar surfaces of planarized spheres 56. In some embodiments, the surface of backplane substrate 10 can be coated with a material such as glass encapsulant, vitrified glass, and/or plastics to reduce and/or eliminate the porosity of the surface of backplane substrate 10 before depositing subsequent layers such as organic light emitting layers 740. In some embodiments, there may be a second electrode layer deposited on contact 710, prior to depositing organic light emitting layers 740 and first electrode 735.

First electrode 735 can be connected to a transistor, power source, and/or an electrical lead on backplane 705, and/or first electrode 735 can be connected to a power source and/or electrical lead independent of backplane 705. When a potential is applied between contact 710 and first electrode 735, organic light emitting layers can emit human visible light, in the direction of light emission 755. Similar to display 700, pixel regions 805,810 of display 800 can each emit only one color, or multiple colors. It is contemplated that other layers may be deposited as part of display 800, which layers can include but are not limited to passivation layers, encapsulation layers, and/or protective layers.

Figure 9:
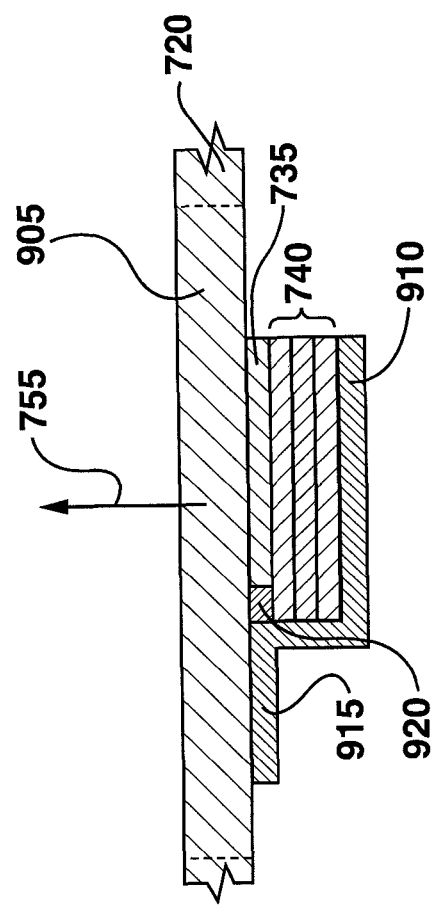
FIG. 9 shows a cross-section of a pixel region of an electroluminescent assembly.

FIG. 9 shows a cross-section of pixel region 905, which can form part of an OLED assembly used to form and OLED display similar to display 700. Pixel region 905 is similar to pixel regions 725,730 in that pixel region 905 comprises an OLED substrate 720, a first electrode 735 formed on OLED substrate 720, organic light emitting layers 740 formed on first electrode 735, and a second electrode 910 formed on organic light emitting layers 740. Pixel region 905 is different from pixel regions 725,730 in that second electrode 910 comprises an extension 915. Extension 915 can span beyond organic light emitting layers 740 and first electrode 735 of pixel region 905. Extension 915 can be formed directly over OLED substrate 720. Second electrode 910 and/or its extension 915 can be insulated from first electrode 735 by insulating region 920. Insulating region 920 can comprise a material and/or medium with sufficiently low electrical conductivity to prevent electrical shorts between first electrode 735 and second electrode 910.

When connecting to backplane 705, conductive link 750 can be formed between contact 710 and extension 915. As the connection point would be insulated and/or spatially removed from first electrode 735, any damage to extension 915 during the connection process is less likely to cause a punch through short between first electrode 735 and second electrode 910. In addition, as extension 915 is spatially removed from organic light emitting layers 740, any thermal, mechanical, and/or chemical damage during the connecting process is less likely to damage the organic light emitting layers 740, which can be susceptible to this type of damage.

Figure 10:
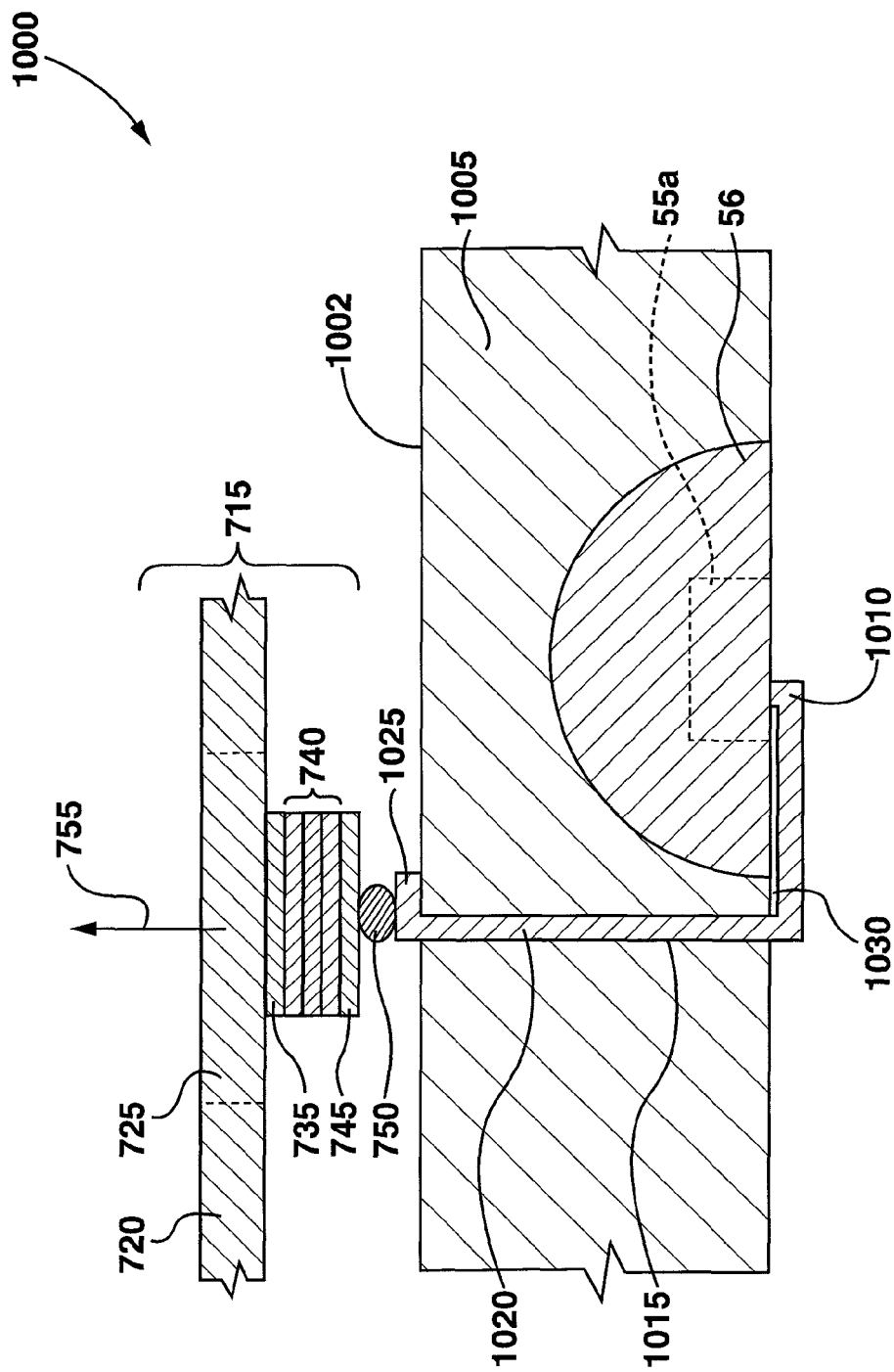
FIG. 10 shows a cross-section of another embodiment of the active matrix display.

FIG. 10 shows active matrix display 1000, which can be an OLED display. Display 1000 is similar to display 700 in that display 1000 comprises OLED assembly 715, having OLED substrate 720, first electrode 735, organic light emitting layers 740, and second electrode 745. When an electrical potential is applied to pixel region 725 across first electrode 735 and second electrode 745, organic light emitting layers 740 can emit human visible light that can pass through first electrode 735 and OLED substrate 720 and be emitted in the direction of light emission 755.

Display 1000 is different from display 700 in the structure of the backplane, in that in display 1000, backplane substrate 1005 comprises one or more vias 1015. Vias 1015 can comprise through passages that connect one face of backplane substrate 1005 to the opposing face. Alternatively and/or in addition, vias 1015 can comprise electrically conductive paths that connect one face of backplane substrate 1005 to the opposing face. Backplane 1002 can comprise transistors 55a formed on and/or beneath the planar surface of planarized spheres 56 secured to backplane substrate 1005. Contact 1010 can be in electrical communication with transistor 55a, have an intermediate portion 1020 that extends through via 1015, and terminate in terminal portion 1025 on or near the face of backplane substrate 1005 opposite the face on which transistor 55a is formed. In embodiments where via 1015 comprises an electrically conductive path, contact 1010 can comprise a conductive link between transistor 55a and a first end of the conductive path. The second end of the conductive path near the opposite face of backplane substrate 1005 can then act as terminal portion 1025 of contact 1010. In these manners, an electrically conductive path can be provided between terminal portion 1025 and transistor 55a. In some embodiments, insulating portion 1030 can electrically insulate some portions of contact 1010 from some portions of planarized sphere 56 and/or transistor 55a.

OLED assembly 715 can electrically connect to backplane 1002 via conductive link 750 between second electrode 745 and terminal portion 1025 of contact 1010. This geometry allows OLED assembly 715 to connect to the face of backplane 1002 opposite the face bearing transistors 55a. Since operation of transistors 55a can generate heat, being able to connect OLED assembly 715 to the face of backplane 1002 opposite the face bearing transistors 55a can distance and at least partially protect OLED assembly 715 from the heat generated by transistors 55a. In particular, organic light emitting layers 740 can be susceptible to damage and/or degradation by heat, so distancing them from heat-generating transistors 55a can reduce the likelihood of thermal damage and prolong the life of OLED assembly 715.

In all the embodiments described above in relation to FIGS. 7-10, the light emitting assembly, such as OLED assembly 715, can be replaced with a detector assembly for detecting photons to yield an imager instead of a display. The detector assembly can detect photons and in response produce an electrical signal. The signal, in turn, can be sampled by a controllable gated electronic component such as transistor 55a and/or other suitable circuit element on the backplane. It is contemplated that the controllable gated electronic components and other circuit elements of an imager can be different than controllable gated electronic components and circuit elements of a display. The detector assembly can be an X-ray detector assembly for converting X-ray photons and in response generating an electrical signal. It is contemplated that the detector assembly can comprise any detector configured to detect an external event and in response produce an electrical signal. For example, the detector can detect external events other than incidence of photons, such as contact with molecules, atoms, and/or subatomic particles. It is envisioned that the detectors can be vertically integrated on top of the backplane.

Figure 11A:
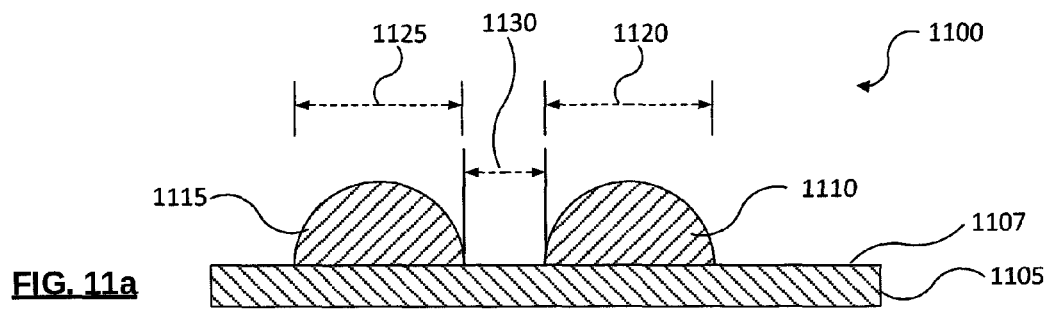
FIGS. 11a through 11e show steps in a method of forming an electronic device on a semiconductor substrate.
Figure 11B:
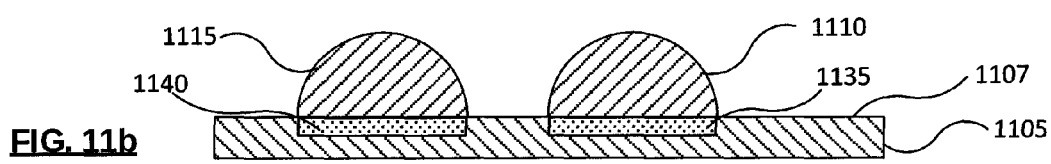

FIGS. 11a-e show steps in a method 1100 for forming an electronic device on a semiconductor substrate. FIG. 11a shows a semiconductor substrate 1105 having a surface 1107. A first quantity 1110 of a liquid medium is deposited on a portion 1120 of surface 1107. A second quantity 1115 of the liquid medium is deposited on a portion 1125 of surface 1107. First quantity 1110 and second quantity 1115 are spaced from one another by a gap 1130.

The liquid medium comprises a dopant configured for doping the semiconductor substrate 1105. The liquid medium can comprise a mixture of an organic component, glass precursors, and the dopant. The organic material can comprise alpha-terpiniol, isopropyl alcohol, polyvinyl alcohol, starches, carboxymethylcellulose, dextrin, wax emulsions, polyethylene glycols, lignosulfonates, methylcellulose, paraffins, polyacrylates, or any other suitable material. In general, a suitable organic material can have one or more of the following characteristics: leave a minimal amount of ash after firing; easily burn out at low temperature; not be abrasive; allow for easy dispersion; not be toxic; and be inexpensive. The glass precursors can comprise silica or any other suitable material. The dopant can comprise boron, phosphorus, or any other suitable material. The liquid medium can be a liquid and/or a paste in conditions (e.g. temperature and pressure) under which it is deposited onto semiconductor substrate 1105.

In addition and/or instead, the liquid medium can comprise any other suitable material or mixture of materials, including but not limited to highly doped Si paste. In some embodiments, the liquid medium can comprise a mixture of dopant, resin, and solvent, such as the mixture described in Hitachi Chemical Technical Report No. 56, incorporated herein by reference in its entirety. It is also contemplated that the liquid medium can comprise nanoparticles dispersed in a solvent, which nanoparticles are doped with the dopant that can be used to dope the semiconductor substrate; for example, see Yang, D. et al. "Doping Silicon Wafers with Boron by Use of Silicon Paste", *J. Mater. Sci. Technol.*, 2013, 29(7), 652-654, which is incorporated herein by reference in its entirety. Another example of the liquid medium can include the "Printable Dopants" made and sold by the Honeywell corporation and described in a publication titled "Honeywell Printable Dopants for Advanced c-Si Cells", which is also incorporated herein by reference in its entirety.

First quantity 1110 and second quantity 1115 can be in the form of any one of a drop, a droplet, a globule, a platelet, a saucer, a blob, a glob, a dab, a smear, or any other quantity of the liquid medium deposited and resting on surface 1107. First quantity 1110 and second quantity 1115 can be the same shape and or amount as one another, or can be of different shape and/or amount from one another.

Since first quantity 1110 and second quantity 1115 are made of a liquid medium, they can be printed on surface 1107 using any suitable printing technique. Some techniques for printing include, but are not limited to, screen printing, inkjet printing, stamping, flexography, gravure, and offset printing. In general, any suitable printing technique can be used, depending on several factors including, but not limited to, the viscosity of the liquid medium comprising the dopant, the resolution and/or minimum feature size, registration accuracy, and printing throughput. The ability to use printing instead of lithography can significantly reduce the cost of the fabrication process.

Although the above description addresses a liquid medium comprising the dopant, it is also contemplated that the dopant can be in the form of and/or be contained in solid particles that are electrostatically deposited on the semiconductor substrate. Such a deposition technique can be similar to the technique used in laser printing to transfer toner particles from the laser printer drum onto the paper, as described above. In other words, solid particles of the dopant and/or solid particles containing the dopant can be laser printed on the semiconductor substrate to form the first and second quantities. Such a laser printing technique may not require transferring any liquid or paste onto the semiconductor substrate. A similar laser printing technique can also be used to print on the semiconductor substrate other components formed in association with fabricating the electronic device (e.g. gate dielectric, source and drain contacts, gate contact, and barrier island), which components are described in greater detail below.

In some embodiments, semiconductor substrate 1105 can be pre-doped and the dopant in the liquid medium can allow changing the doping of semiconductor substrate 1105. For example, if semiconductor substrate 1105 is p pre-doped, the dopant in the liquid medium can allow semiconductor substrate 1105 to be n-doped, and vice versa. In the exemplary drawing of FIG. 11, semiconductor substrate 1105 can be pre-doped and used to form the conduction channel of a field-effect transistor electronic device, the conduction channel extending between the source and the drain of the transistor. The dopant from first quantity 1110 and second quantity 1115 can be used to further dope (and/or change the doping of) semiconductor substrate 1105 to form the source and the drain of the transistor.

Once first quantity 1110 and second quantity 1115 have been deposited on surface 1107, substrate 1105, first quantity 1110 and second quantity 1115 can be heated to cause diffusion of at least some of the dopant from the liquid medium of each of first quantity 1110 and second quantity 1115 into surface 1107. The heating step can be performed in a furnace. FIG. 11 b shows substrate 1105 after such a heating step, which depicts a first doped region 1135 doped from the dopant originating from first quantity 1110 and a second doped region 1140 doped from the dopant originating from second quantity 1115.

The shape and size of the doped region depends on multiple factors, including but not limited to, nature of the dopant, composition of substrate 1105, and the heating profile (e.g. temperature over time). The shape and relative sizes of doped regions 1135,1140 shown in FIG. 11b (and in all the FIGS. that follow) are for illustrative purposes only, and are not intended to be limiting. Moreover, the shape and size of first quantity 1110 and second quantity 1115 are shown as being unchanged between FIG. 11a (before heating) and FIG. 11b (after heating). This is for ease of illustration only, and it is contemplated that the shape, size, state, and/or composition of first quantity 1110 and second quantity 1115 can change after the heating step.

In some embodiments, instead of the heating, a laser beam can be directed onto surface 1107 to drive the dopant from first quantity 1110 and second quantity 1115 into surface 1107. The use of a laser to facilitate doping can avoid heating the entire semiconductor substrate 1105 to high temperatures, and can allow for use of plastic and/or flexible substrates.

Figure 11C:
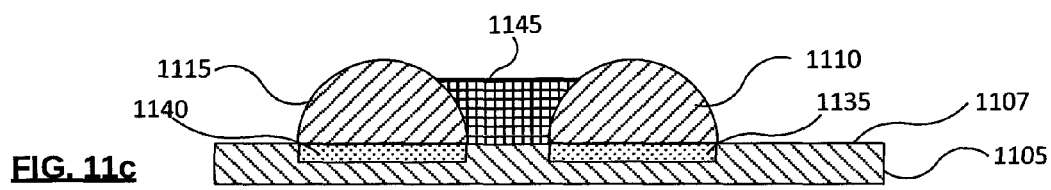

Once substrate 1105 has been doped by the dopant from the liquid medium, a dielectric material 1145 can be deposited on surface 1107 in gap 1130 (gap 1130 is not marked in FIG. 11c, but is marked in FIG. 11a). FIG. 11c shows the dielectric material 1145 deposited in gap 1130. Dielectric material 1145 can comprise aluminum oxide, a plastic such as polyimide, or any other suitable dielectric material. In some embodiments, dielectric material 1145 can comprise a polystyrene-block-poly(methylmethacrylate) composite material, such as the material described in Ko, F. et al. "Polystyrene-block-poly(methylmethacrylate) composite material film as a gate dielectric for plastic thin-film transistor applications" *RSC Adv.*, 2014, 4, 18493, which is incorporated herein by reference in its entirety. It is also contemplated that the dielectric material can be grown in the gap on the semiconductor substrate. For example, in embodiments where the semiconductor substrate comprises silicon, a silicon oxide ($SiO_2$) layer can be grown in the gap as the dielectric material.

First quantity 1110 and second quantity 1115 can act as templates for the deposition of dielectric material 1145 in gap 1130. In some embodiments, dielectric material 1145 can also be deposited by depositing a quantity of a liquid and/or paste comprising the dielectric material on surface 1107 in gap 1130. Such a liquid/paste quantity comprising the dielectric material can be deposited by printing the liquid/paste on surface 1107 in gap 1130. In embodiments where the dielectric material is printed, the dielectric material containing liquid/paste can be in the liquid/paste state in conditions under which it is transferred and/or printed onto surface 1107. Dielectric material 1145 can be printed using the techniques described above in relation to first quantity 1110 and second quantity 1115

While dielectric material 1145 is shown as having a particular shape (e.g. flat top and curved sides), it is contemplated that dielectric material 1145 can have any other suitable shape. For example, if dielectric material 1145 has a large wetting angle with first quantity 1110 and/or second quantity 1115 (i.e. if the dielectric material does not readily wet the first and second quantities), then dielectric material 1145 can have a convex shape.

Once dielectric material 1145 has been deposited, first quantity 1110 and second quantity 1115 can be selectively removed from surface 1107. FIG. 11 d shows semiconductor substrate 1105 with first quantity 1110 and second quantity 1115 selectively removed. For example, selective wet chemical etching can be used to remove first quantity 1110 and second quantity 1115 while leaving intact semiconductor substrate 1105 and dielectric material 1145. It is contemplated that any suitable selective removal method can be used depending on the composition of first quantity 1110, second quantity 1115, semiconductor substrate 1105, and dielectric material 1145. For example, if first quantity 1110 and second quantity 1115 comprise silica/glass, semiconductor substrate 1105 comprises silicon, and dielectric material 1145 comprises polyimide, then a wet chemical etching agent such as hydrofluoric acid or other suitable acid can be used to selectively remove first quantity 1110 and second quantity 1115 from surface 1107.

Once first quantity 1110 and second quantity 1115 have been selectively removed, electrical contacts 1150,1155 can be deposited on first portion 1120 and second portion 1125 (marked in FIG. 11a) of surface 1107. In addition, an electrical contact 1160 can be deposited on dielectric material 1145. FIG. 11e shows semiconductor substrate 1105 after the deposition of electrical contacts 1150,1155,1160. While FIG. 11e shows electrical contact 1150 as covering the entirety of first portion 1120 and shows electrical contact 1155 as covering the entirety of second portion 1125, it is contemplated that electrical contact 1150 can partially cover first portion 1120 and/or electrical contact 1155 can partially cover second portion 1125. Electrical contact 1160 is deposited such that it does not come into electrical contact with electrical contacts 1150 and 1155.

These electrical contacts 1150,1155,1160 can be printed using the techniques described above in relation to first quantity 1110 and second quantity 1115, or formed using any other suitable technique. One or more of electrical contacts 1150,1155,1160 can comprise a metal, metal particles, or any other suitable conductive material.

The structure shown in FIG. 11e can form a field effect transistor where electrical contact 1150 acts as the drain contact (marked "D" in FIG. 11e), electrical contact 1155 acts as the source contact (marked "S" in FIG. 11e), electrical contact 1160 acts as the gate contact, and dielectric material 1145 acts as the gate barrier. The conduction channel of the transistor can comprise the region inside semiconductor substrate 1105 (i.e. below surface 1107) between doped regions 1135 and 1140.

A field effect transistor (FET) fabricated by method 1100 and the other methods discussed below can have advantages over lithographically-fabricated FETs and thin-film transistors (TFT). Regarding lithographically-fabricated FETs, traditional lithography can be very expensive, whereas method 1100 (and the other methods discussed below) can be carried out inexpensively using a material printer (e.g. a desktop inkjet printer) and a furnace. Regarding TFTs, their fabrication can be limited by low thermal budgets (because excessive heat can damage their thin film components) and the TFTs themselves can have limited performance (e.g. relatively low electron mobility) due to the potentially poor quality of the thin layers that form the FETs. In contrast, fabricating FETs by method 1100 (and the other methods described below) can have a higher thermal budget because 1) there are no thin films that could be vulnerable to high temperatures, and 2) semiconductor substrate 1105 can comprise a high-quality crystalline semiconductor that can have high electron mobility and can be less sensitive to high temperatures than thin films of a TFT.

Generally, if the semiconductor substrate (that is used to form the conduction channel between the source and the drain) of an electronic device (e.g. a FET) is printed, such devices can have limited performance due to the low electron mobility of semiconductor materials that can typically be achieved by printing. In contrast, in method 1100 (and the other methods described below) semiconductor substrate 1105 (used to form the conduction channel) need not be printed, but rather can be a high quality, crystalline semiconductor material with relatively high electron mobility. In this way, method 1100 combines the low cost advantages of printing electronics, with the high performance (e.g. high electron mobility) and higher thermal budget made possible by using a high quality, crystalline semiconductor substrate onto which other components can be printed.

Semiconductor substrate 1105 can comprise any semiconductor material suitable for forming electronic devices. In some embodiments, semiconductor substrate 1105 can comprise a planarized semiconductor particle fixed upon another substrate, such as the planarized sphere 56 shown in FIG. 5b. Other examples of semiconductor substrate 1105 can include, but are not limited to, planarized spheres 16 shown in FIGS. 3 and 4.

In some embodiments, semiconductor substrate 1105 can comprise planarized islands of a semiconductor material formed in situ on another (e.g. non-semiconductor) substrate by heating particulate/powder semiconductor precursors deposited on the other substrate. The heating can melt and fuse the particles to form a molten globule. Cooling the globule can solidify and crystallize the molten globule to form a crystalline island of the semiconductor material secured to the other substrate. This method of forming semiconductor islands is described in U.S. Pat. No. 9,396,932 and also in U.S. patent application Ser. No. 15/184,429, both of which are incorporated herein by reference in their entirety. When planarized, such semiconductor islands can act as semiconductor substrate 1105.

In certain circumstances, the in situ formation of semiconductor islands can yield disk-shaped semiconductor islands as described in U.S. patent application Ser. No. 15/184,429. A non-limiting example of such circumstances includes heating a silicon precursor (powder or pieces) on an alumina substrate to a temperature above the melting point of silicon (e.g. 1500° C.) in the presence of oxygen (either in the atmospheres or in another material in contact with the molten globule). Under these conditions, a disk/layer comprising silica can form between the crystalline silicon island and the alumina substrate, and the crystalline silicon island can be disk-shaped. Such a disk-shaped silicon island can also be used (optionally after polishing and/or planarization) as semiconductor substrate 1105.

Surface 1107 can comprise a planar surface. In embodiments where semiconductor substrate 1105 comprises a planarized semiconductor particle, surface 1107 can comprise the planar surface formed at the planarized cross-section of the planarized semiconductor particle. Moreover, while FIGS. 11a-e show surface 1107 as being planar, it is contemplated that surface 1107 can also be curved. For example, surface 1107 can comprise the curved or otherwise non-planar outer surface of a semiconductor particle or the curved surface of a flexible semiconductor substrate. Semiconductor substrate 1105 can comprise a poly- or single-crystalline semiconductor material, including but not limited to, silicon. Semiconductor substrate 1105 can be pre-doped before steps of method 1100 are carried out In some embodiments, semiconductor substrate 1105 can comprise a semiconductor wafer, or other suitable poly- or single-crystalline semiconductor substrate other than a semiconductor particle that is formed separately from another substrate and then fixed upon that other substrate.

In some embodiments, the gate contact (formed by electrical contact 1160) can be deposited after the depositing of dielectric material 1145 and before the selective removal of first quantity 1110 and second quantity 1115. In these embodiments, electrical contact 1160 is selected to be impervious to and/or unaffected by the selective removal method used to selectively remove first quantity 1110 and second quantity 1115.

In some embodiments, a barrier island can be deposited on the surface in the gap before the first and second quantities are deposited. This barrier island can help to control the length of the gap, which is determined by (among other factors) the distance between the first and second quantities. As the length of the gap determines (along with other factors) the length of the conduction channel of the FET inside the semiconductor substrate, controlling the length of the gap can help to control the length of the conduction channel and the performance characteristics of the FET.

In some embodiments, the length of the gap, i.e. the distance between the first and second quantities, can be in the range of about 0.1 µm to about 100 µm. In other embodiments, the length of the gap, i.e. the distance between the first and second quantities, can be in the range of about 0.1 µm to about 10 µm. In yet other embodiments, the length of the gap, i.e. the distance between the first and second quantities, can be in the range of about 0.1 µm to about 5 µm.

Figure 12A:
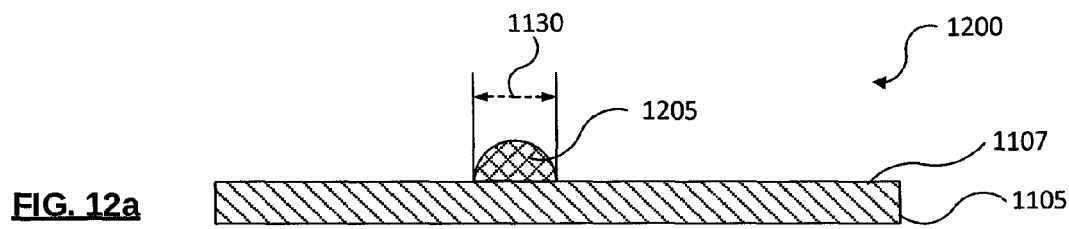
FIGS. 12a through 12f show steps in another method of forming an electronic device on a semiconductor substrate.

FIGS. 12a-f show steps in a method 1200 for forming an electronic device (e.g. a FET) using such a barrier island. FIG. 12a shows barrier island 1205 deposited on surface 1107 in gap 1130. Barrier island 1205 can be formed of any suitable material that can form a barrier to first quantity 1110 and second quantity 1115, and can be selectively removed from substrate 1105, as will be discussed in greater detail below. In some embodiments, barrier island 1205 can be deposited as a liquid and/or paste quantity. The liquid/paste comprising a barrier material (used to form the barrier island) can comprise an organic material such as a plastic such as polyimide, or any other suitable material. The liquid/paste comprising the barrier material can be printed on semiconductor substrate 1105 using the same methods described above in relation to printing first quantity 1110 and second quantity 1115.

While one or more of the first quantity, the second quantity, the dielectric material, the barrier island, and the electrical contacts can be deposited using a printing technique, it is contemplated that two or more different printing techniques can be used to print these components.

Figure 12B:
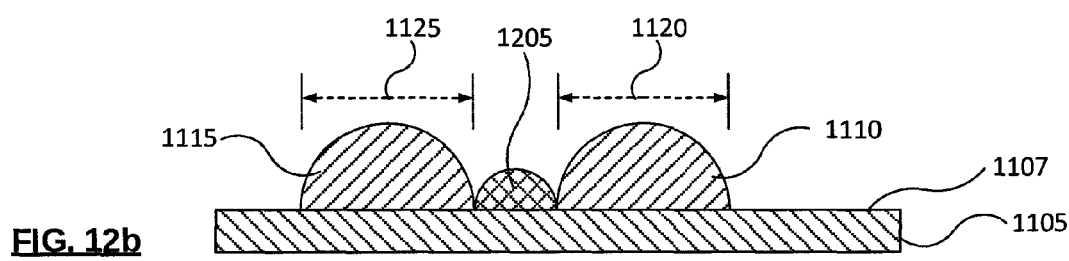

After depositing barrier island 1205 in gap 1130, first quantity 1110 and second quantity 1115 can be deposited on first portion 1120 and second portion 1125 of surface 1107 respectively, as shown in FIG. 12b. As discussed above, barrier island 1205 can act as a barrier preventing first quantity 1110 and second quantity 1115 from encroaching (e.g. by flowing and/or spreading) onto gap 1130.

Figure 12C:
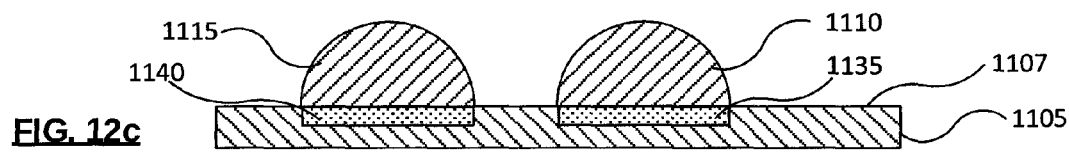
Figure 12D:
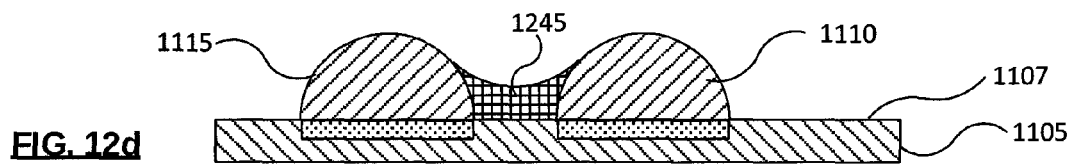

Next, semiconductor substrate 1105, first and second quantities 1110 and 1115, and barrier island 1205 can be heated to cause diffusion of at least some of the dopant from first and second quantities 1110 and 1115 into surface 1107 to form doped regions 1135 and 1140 respectively, as shown in FIG. 12c. The heating can also selectively remove (e.g. burn off) barrier island 1205 to clear surface 1107 in gap 1130 for later deposition of a dielectric material 1245, as shown in FIG. 12d. In some embodiments, barrier island 1205 can be selectively removed using wet chemical etching or other selective removal method other than heating.

Dielectric material 1245 can have a composition and be deposited in a manner similar to dielectric material 1145. Dielectric material 1245 can have a small wetting angle with first quantity 1110 and second quantity 1115. Dielectric material 1245 can wet first quantity 1110 and second quantity 1115 at a wetting angle smaller than about 90°. In other words, dielectric material 1245 can readily wet first quantity 1110 and second quantity 1115. This can in turn determine the shape of dielectric material 1245, i.e. having a concave top and curved sides, as shown in FIGS. 12d-f.

Figure 11D:
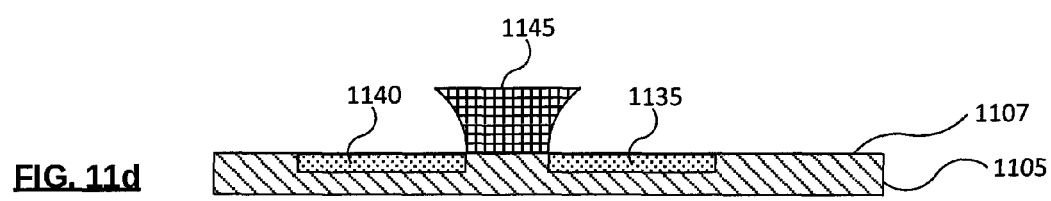
Figure 11E:
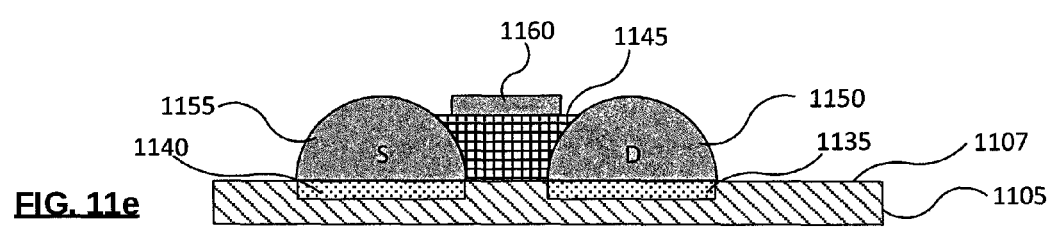
Figure 12E:
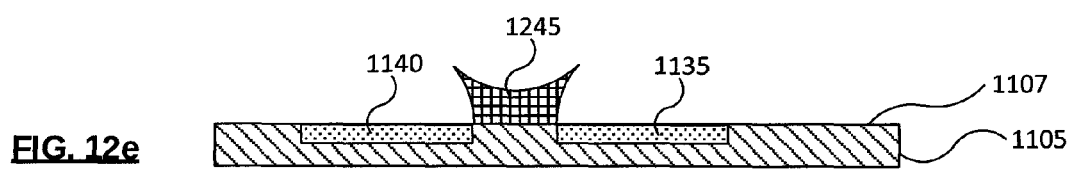
Figure 12F:
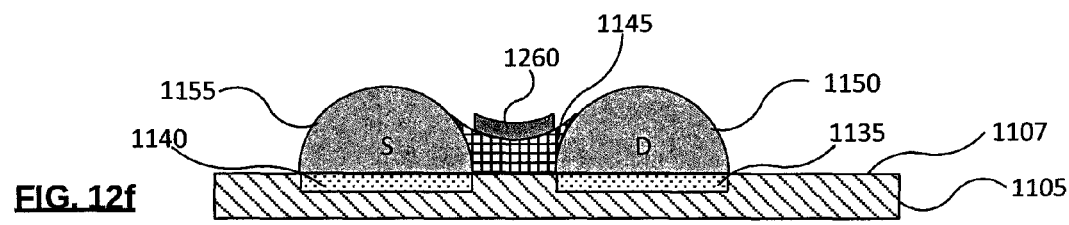

After the deposition of dielectric material 1245, steps of method 1200 depicted in FIGS. 12d, 12e, and 12f are generally similar to the steps of method 1100 shown in FIGS. 11c, 11d, and 11e, with one difference being that electrical contact 1260 is shaped differently than electrical contact 1160. The shape of electrical contact 1260 is determined by the curvature of the top surface of dielectric material 1245. In the embodiments where electrical contact 1260 is deposited and/or printed as a liquid, the concave top of dielectric material 1245 can pool and/or direct the electrical contact away from electrical contacts 1150 and 1155. This can help in preventing any electrical shorts between electrical contact 1260 and electrical contacts 1150 and 1155 respectively.

While dielectric material 1145 is shown in FIG. 11 as having a different shape than dielectric material 1245 in FIG. 12, it is contemplated that the dielectric material in one or both of methods 1100 and 1200 can be shaped similar to either one of dielectric material 1145 or dielectric material 1245.

In some embodiments, barrier island 1205 can comprise the same material as dielectric material 1245, in which case barrier island 1205 is not selectively removed, but rather remains on surface 1107 throughout the steps of method 1200. In these embodiments, however, barrier island 1205 may not have the same shape as dielectric material 1245 because the barrier island 1205 would have been deposited before the deposition of first quantity 1110 and second quantity 1115.

In some embodiments, the liquid medium of the first and second quantities can undergo a reduction in volume after being deposited on the surface of the semiconductor substrate. This reduction in volume can be due to various factors including, but not limited to, evaporation of some or all of any volatile components of the liquid medium during a "bake out" step. FIGS. 13a-g show steps of a method 1300 for forming an electronic device, which method uses this reduction in volume.

Figure 13A:
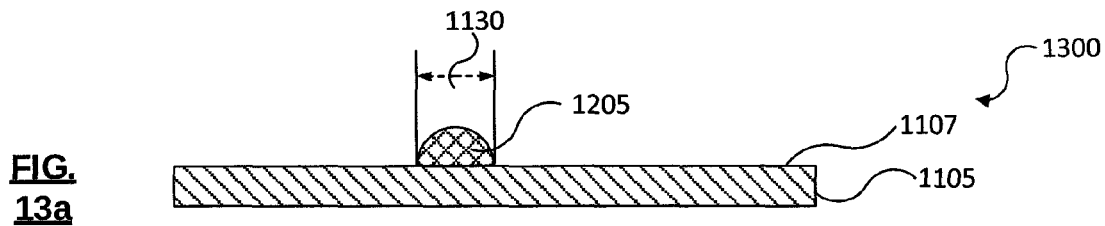
FIGS. 13a through 13g show steps in another method of forming an electronic device on a semiconductor substrate.
Figure 13B:
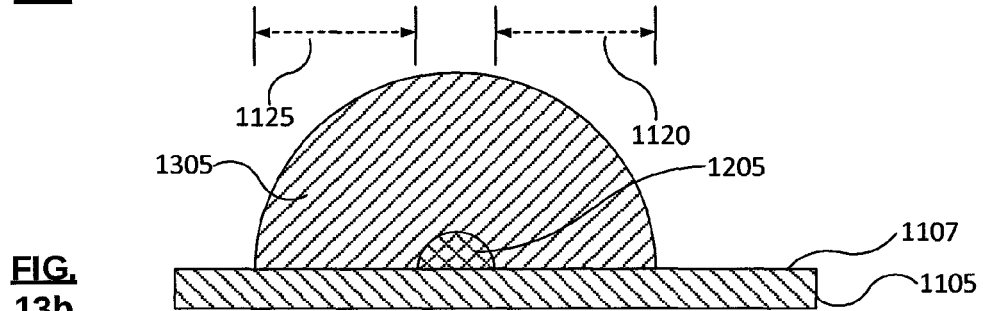

First, as shown in FIG. 13a, barrier island 1205 is deposited on surface 1107. This step can be similar to the first step in method 1200 shown in FIG. 12a. Next, as shown in FIG. 13b, an initial quantity 1305 of the liquid medium (comprising the dopant) can be deposited on surface 1107 to cover first portion 1120 and second portion 1125 of surface 1107 as well as covering barrier island 1205, which in turn covers gap 1130. As discussed above, barrier island 1205 can be disposed in gap 1130 between first portion 1120 and second portion 1125. Volume of initial quantity 1305 is larger than the combined volumes of first quantity 1110 and second quantity 1115.

Figure 13C:
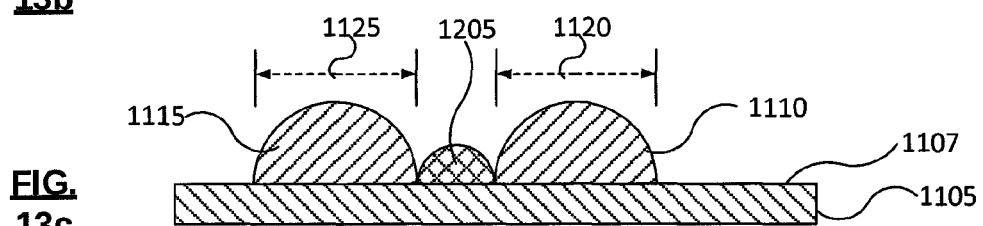
Figure 13D:
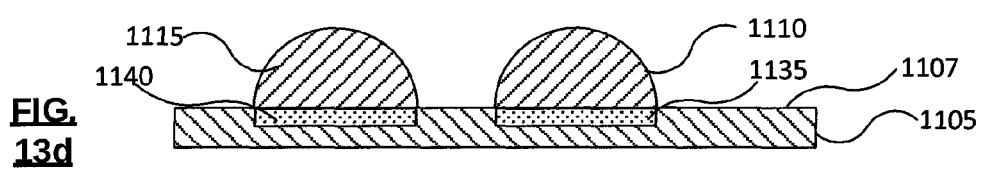
Figure 13E:
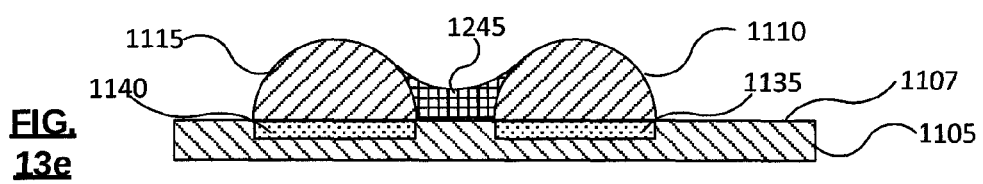
Figure 13F:
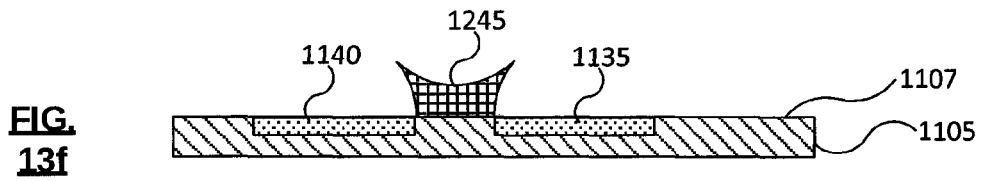
Figure 13G:
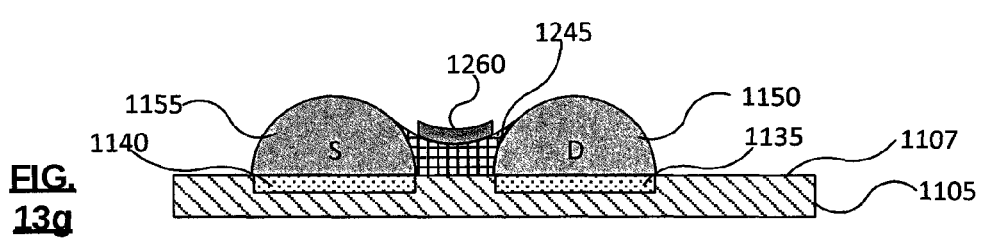

During the bake out step, the volume of initial quantity 1305 will be reduced as discussed above. The bake out, and the accompanying reduction in volume, can be due to preliminary heating, or any other step that can cause a reduction in the volume of initial quantity 1305 due to an at least partial loss of volatile components of the liquid medium. FIG. 13c shows that after the volume of initial quantity 1305 is reduced during the bake out, previously-covered barrier island 1205 can be exposed, and initial quantity 1305 can form smaller first quantity 1110 and second quantity 1115. While FIG. 13c shows first quantity 1110 to be the same shape and size as second quantity 1115, it is contemplated that the first and second quantities formed as a result of the bake out can have different shapes and sizes from one another. In addition, while in FIGS. 13c-e first quantity 1110 and second quantity 1115 are depicted as being of similar shape and size as the corresponding first and second quantities in FIGS. 11a-c and 12b-d, it is contemplated that the first and second quantities obtained by a reduction in the volume of initial quantity 1305 (in method 1300) can have a shape and/or size that is different than the first and second quantities that are deposited on semiconductor substrate 1105 in methods 1100 (FIG. 11) and 1200 (FIG. 12).

The last five steps of method 1300 shown in FIGS. 13c-13g can be similar to the last five steps of method 1200, as shown in FIGS. 12b-f, and will not be described here in detail again.

In some embodiments, the barrier island can be formed by depositing a layer of photo-reactive material on the surface of the semiconductor substrate, exposing an area of the photo-reactive material overlaying the gap to light to modify the photo-reactive material, and selectively removing unexposed regions of the photo-reactive material from the surface thereby forming the barrier island comprising the photo-reactive material modified by the light. The photo-reactive material can comprise a photo-resist including, but not limited to, a negative photo-resist such as the Shipley BPR™-100 Photoresist. Exposing the photo-reactive material to light can be performed without the need for expensive and/or complicated photolithography equipment. For example, the light exposure can be performed using a light source, such as a UV LED or laser, attached to the print head of an inkjet printer.

FIGS. 14a-g show steps in a method 1400 where a barrier island is formed by exposing a layer of a photo-reactive material and then selectively removing the unexposed portions. FIG. 14a shows a layer of a photo-reactive material 1405 deposited on substrate 1105. Photo-reactive material 1405 can be spin-coated, or deposited on the semiconductor substrate using any other suitable technique. Photo-reactive material 1405 can comprise a photo-resist, or any other suitable material, including, but not limited to, a negative photo-resist such as the Shipley BPR™-100 Photoresist.

Then, a region of the photo-reactive material overlaying gap 1130 (marked in FIG. 14b) can be exposed to a light that is configured to modify the photo-reactive material. After this exposure and modification, the unexposed portions of the layer of photo-reactive material 1405 can be selectively removed to form a barrier island 1410 comprising the photo-reactive material modified by the light, as shown in FIG. 14b. By utilizing an optical source such as a UV laser, having a micron, or sub-micron spot size, it can be possible to direct-write small features such as barrier island 1410. The selective removal step can remove the unexposed portions of the layer of photo-reactive material 1405, while leaving the exposed portion of the photo-reactive material and the semiconductor substrate intact. The selective removal can comprise wet chemical etching or any other suitable selective removal method.

Once barrier island 1410 has been formed, first quantity 1110 can be deposited on first portion 1120 and second quantity 1115 can be deposited on second portion 1125 of surface 1107, as shown in FIG. 14c. The last five steps of method 1400, shown in FIGS. 14c-g can be similar to the last five steps of method 1200, shown in FIGS. 12b-f, and will not be described in detail again here.

Methods 1100, 1200, 1300, and 1400 can be used to form and/or fabricate controllable gated electronic components, including but not limited transistors such as FETs. As discussed above, these methods can be carried out on semiconductor substrates which are the planarized semiconductor particles, which particles are formed separately from another substrate and then immovably fixed to that other substrate. For example, transistors 55a,55b, shown in FIGS. 5c, 7, 8, and 10 can be formed using one or more of methods 1100, 1200, 1300, and 1400.

The above-described embodiments of the invention are intended to be examples of the present invention and alterations and modifications may be effected thereto, by those of skill in the art, without departing from the scope of the invention which is defined solely by the claims appended hereto.

What is claimed is:

1. A method of forming a plurality of electronic devices on a substrate, the method comprising:
   providing semiconductor particles formed separately from the substrate;
   positioning the semiconductor particles at predetermined positions on the substrate;
   immovably fixing the semiconductor particles to the substrate at the predetermined positions;
   after immovably fixing the semiconductor particles, removing portions of each of the semiconductor particles so as to expose cross-sections of the semiconductor particles, wherein the cross-sections are planar surfaces; and
   providing one or more controllable gated electronic components on or directly beneath each planar surface, the providing the one or more controllable gated electronic components comprising, for each planar surface:
      depositing a first quantity of a first liquid medium comprising a dopant on a first portion of the planar surface and depositing a second quantity of the first liquid medium on a second portion of the planar surface, the first quantity spaced from the second quantity by a gap;
      heating the first quantity, the second quantity, and the corresponding semiconductor particle, the heating configured to cause diffusion of at least some of the dopant from the first liquid medium into the planar surface;
      depositing a dielectric material on the planar surface in the gap;
      selectively removing the first quantity and the second quantity from the planar surface;
      depositing an electrical contact on each of the first portion and the second portion; and
      depositing a further electrical contact on the dielectric material.

2. A method of forming an electronic device on a substrate, the method comprising:
   providing a semiconductor particle formed separately from the substrate;
   immovably fixing the semiconductor particle to the substrate;
   after the immovably fixing, depositing a first quantity of a first liquid medium comprising a dopant on a first portion of a surface of the semiconductor particle and depositing a second quantity of the first liquid medium on a second portion of the surface, the first quantity spaced from the second quantity by a gap;
   heating the first quantity, the second quantity, and the semiconductor particle, the heating configured to cause diffusion of at least some of the dopant from the first liquid medium into the surface;
   depositing a dielectric material on the surface in the gap;
   selectively removing the first quantity and the second quantity from the surface;
   depositing an electrical contact on each of the first portion and the second portion; and
   depositing a further electrical contact on the dielectric material.

3. The method of claim 2, further comprising:
   before the depositing the first quantity and the second quantity, forming a barrier island on the surface in the gap; and
   before the depositing the dielectric material, selectively removing the barrier island from the surface.

4. The method of claim 3, wherein the forming the barrier island comprises:
   depositing a third quantity of a second liquid medium comprising a barrier material on the surface in the gap.

5. The method of claim 3, wherein the forming the barrier island comprises:
   depositing a layer of a photo-reactive material on the surface;
   exposing a region of the photo-reactive material overlaying the gap to a light configured to modify the photo-reactive material; and
   selectively removing unexposed regions of the layer of the photo-reactive material from the surface, thereby forming the barrier island comprising the photo-reactive material modified by the light.

6. The method of claim 2, wherein the depositing the dielectric material comprises:
   depositing a fourth quantity of a third liquid medium comprising the dielectric material on the surface in the gap.

7. The method of claim 6, wherein the fourth quantity wets the first quantity and the second quantity at a wetting angle smaller than about 90°.

8. The method of claim 3, wherein the heating also selectively removes the barrier island from the surface.

9. The method of claim 3, wherein the depositing the first quantity and the second quantity comprises:
   depositing an initial quantity of the first liquid medium on the surface, the initial quantity covering the first portion of the surface, the second portion of the surface, and the barrier island disposed between the first portion and the second portion; and
   heating the initial quantity to reduce a volume of the initial quantity by at least partially evaporating one or more components of the first liquid medium, thereby exposing the barrier island and forming the first quantity and the second quantity separated from one another by the barrier island.

10. The method of claim 2, wherein the surface comprises a planar surface.

11. The method of claim 10, wherein the planar surface comprises a planarized surface of the semiconductor particle.

12. The method of claim 2, wherein the first quantity is spaced from the second quantity by the gap in a range of about 0.1 µm to about 100 µm.

13. The method of claim 2, wherein printing is used for one or more of:
    the depositing the first quantity;
    the depositing the second quantity;
    the depositing the dielectric material;
    the depositing the electrical contact on each of the first portion and the second portion; and
    the depositing the further electrical contact.

14. The method of claim 13, wherein the printing comprises one or more of:
    screen printing;
    flexography;
    gravure;
    stamping;
    offset printing; and
    inkjet printing.

15. A method of forming an electronic device, the method comprising:
- providing a semiconductor substrate having a surface comprising a first portion and a second portion, the first portion spaced from the second portion by a gap;
- forming a barrier island on the surface in the gap;
- depositing a first quantity of a first liquid medium comprising a dopant on the first portion of the surface and a second quantity of the first liquid medium on the second portion of the surface, the first quantity separated from the second quantity by the barrier island;
- heating the first quantity, the second quantity, and the semiconductor substrate, the heating configured to cause diffusion of at least some of the dopant from the first liquid medium into the surface;
- selectively removing the barrier island from the surface;
- depositing a dielectric material on the surface in the gap;
- selectively removing the first quantity and the second quantity from the surface;
- depositing an electrical contact on each of the first portion and the second portion; and
- depositing a further electrical contact on the dielectric material.

16. The method of claim 15, wherein the forming the barrier island comprises:
- depositing a third quantity of a second liquid medium comprising a barrier material on the surface in the gap.

17. The method of claim 15, wherein the forming the barrier island comprises:
- depositing a layer of a photo-reactive material on the surface;
- exposing a region of the photo-reactive material overlaying the gap to a light configured to modify the photo-reactive material; and
- selectively removing unexposed regions of the layer of the photo-reactive material from the surface, thereby forming the barrier island comprising the photo-reactive material modified by the light.

18. The method of claim 15, wherein the depositing the dielectric material comprises:
- depositing a fourth quantity of a third liquid medium comprising the dielectric material on the surface in the gap.

19. The method of claim 18, wherein the fourth quantity wets the first quantity and the second quantity at a wetting angle smaller than about 90°.

20. The method of claim 15, wherein the heating also selectively removes the barrier island from the surface.

21. The method of claim 15, wherein the depositing the first quantity and the second quantity comprises:
- depositing an initial quantity of the first liquid medium on the surface, the initial quantity covering the first portion of the surface, the second portion of the surface, and the barrier island disposed between the first portion and the second portion; and
- heating the initial quantity to reduce a volume of the initial quantity by at least partially evaporating one or more components of the first liquid medium, thereby exposing the barrier island and forming the first quantity and the second quantity separated from one another by the barrier island.

22. The method of claim 15, wherein the surface comprises a planarized surface of the semiconductor substrate.

23. The method of claim 15, wherein printing is used for one or more of:
- the depositing the first quantity;
- the depositing the second quantity;
- the depositing the dielectric material;
- the depositing the electrical contact on each of the first portion and the second portion; and
- the depositing the further electrical contact.

* * * * *